United States Patent
Chen et al.

(10) Patent No.: US 11,728,275 B2
(45) Date of Patent: Aug. 15, 2023

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Ming-Fa Chen, Taichung (TW); Hsien-Wei Chen, Hsinchu (TW); Jie Chen, New Taipei (TW); Sung-Feng Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 82 days.

(21) Appl. No.: 17/206,117

(22) Filed: Mar. 18, 2021

(65) Prior Publication Data

US 2022/0302034 A1 Sep. 22, 2022

(51) Int. Cl.
*H01L 23/538* (2006.01)
*H01L 25/065* (2023.01)
*H01L 21/78* (2006.01)
*H01L 23/31* (2006.01)
*H01L 23/544* (2006.01)

(52) U.S. Cl.
CPC .......... *H01L 23/5384* (2013.01); *H01L 21/78* (2013.01); *H01L 23/31* (2013.01); *H01L 23/544* (2013.01); *H01L 25/0657* (2013.01); *H01L 2224/0401* (2013.01)

(58) Field of Classification Search
CPC .............. H01L 23/5384; H01L 23/554; H01L 25/0657; H01L 21/78
See application file for complete search history.

(56) References Cited

U.S. PATENT DOCUMENTS

| | | | |
|---|---|---|---|
| 7,262,586 B1 * | 8/2007 | Gradinariu | G05F 1/56 323/280 |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2018/0012868 A1 * | 1/2018 | Huang | H01L 24/94 |
| 2019/0148342 A1 * | 5/2019 | Hu | H01L 25/105 257/659 |

* cited by examiner

*Primary Examiner* — Dale E Page
*Assistant Examiner* — Wilner Jean Baptiste
(74) *Attorney, Agent, or Firm* — JCIPRNET

(57) ABSTRACT

A semiconductor package and a manufacturing method thereof are provided. The semiconductor package includes a first device die and a second device die. The first device die includes first bonding pads at a front surface of the first device die. The second device die is bonded on the first device die, and includes die regions and a scribe line region connecting the die regions with one another. The die regions respectively comprise second bonding pads at a front surface of the second device die. The second bonding pads are respectively in contact with one of the first bonding pads.

19 Claims, 20 Drawing Sheets

SEMICONDUCTOR PACKAGE AND MANUFACTURING METHOD THEREOF

BACKGROUND

In recent years, the semiconductor industry has experienced rapid growth due to continuous improvement in integration density of various electronic components. These continuously scaled electronic components require smaller packages that occupy less area than previous packages. However, there are physical limitations to the scaling of semiconductor packages that can be achieved in two dimensions (2D). While 2D scaling remains an option for new designs, adopting three-dimensional (3D) packaging schemes that utilize the z-direction has become a focus of research in the industry. Nevertheless, there are still challenges to be handled for the 3D packaging technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
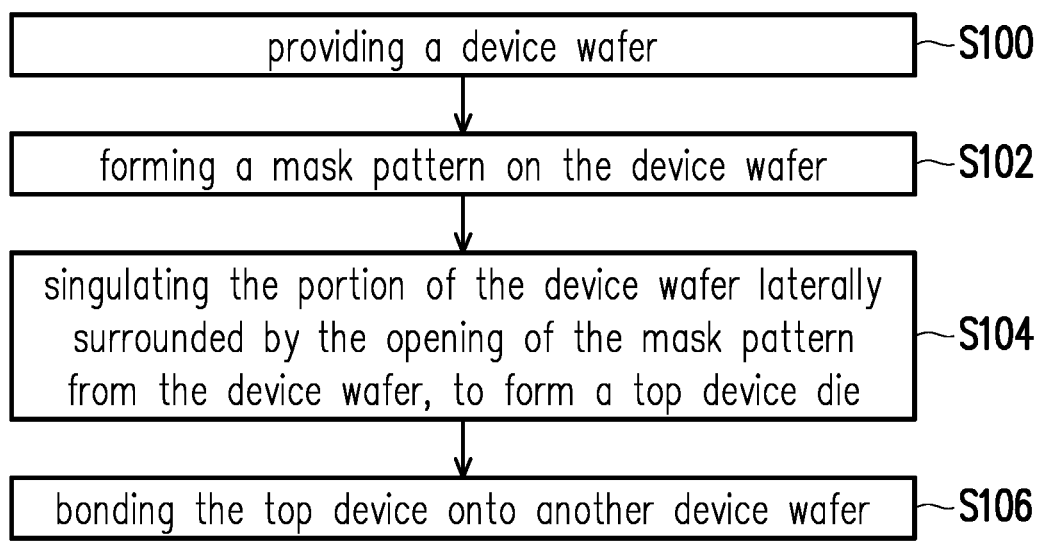
FIG. 1 is a flow diagram illustrating a method for forming a semiconductor structure according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
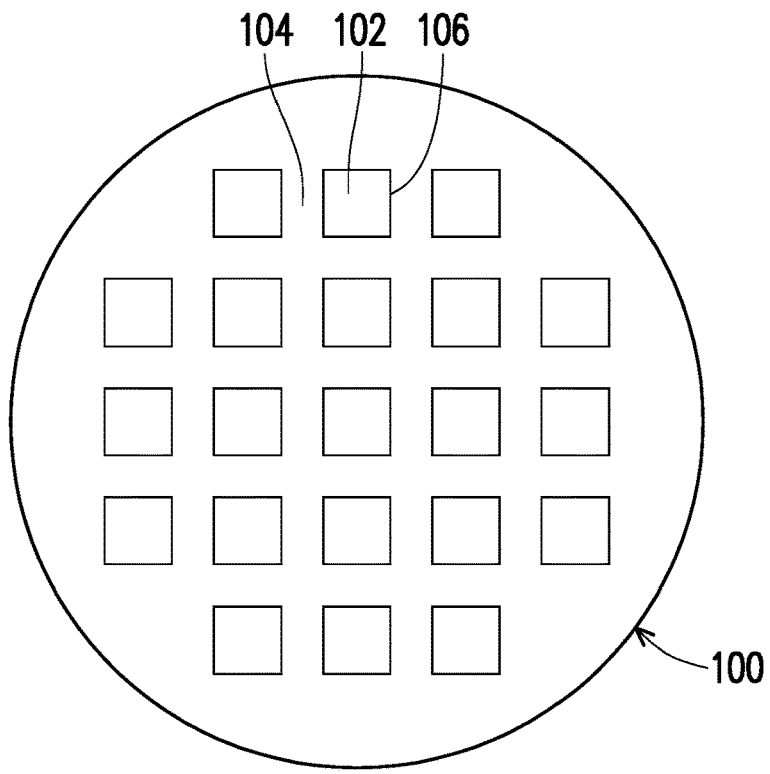
FIG. 2A through FIG. 2E are schematic plan views illustrating various stages during the formation of the semiconductor structure shown in FIG. 1.
Figure 2B:
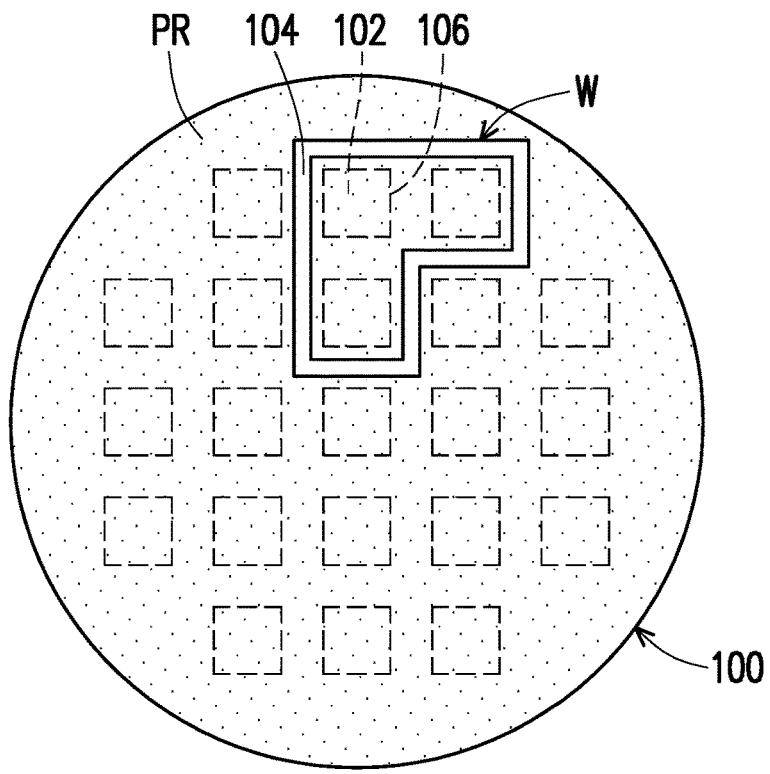
Figure 2C:
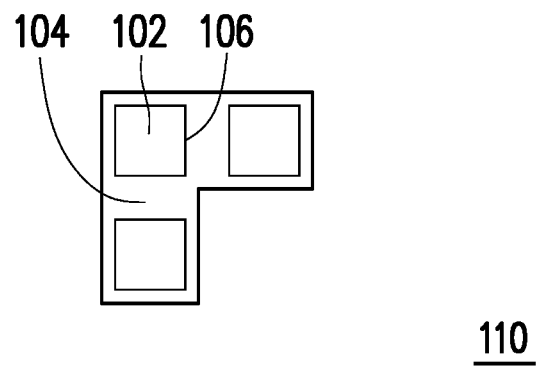
Figure 2D:
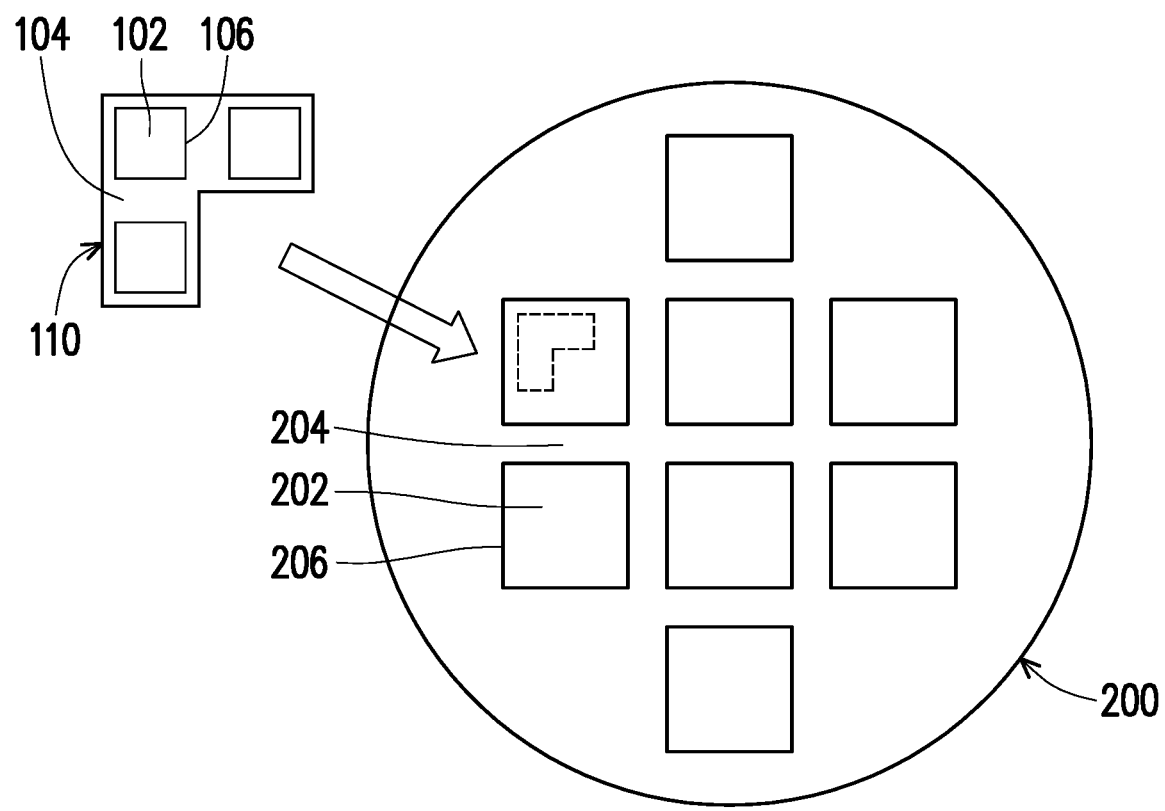

FIG. 1 is a flow diagram illustrating a method for forming a semiconductor structure according to some embodiments of the present disclosure. FIG. 2A through FIG. 2E are schematic plan views illustrating various stages during the formation of the semiconductor structure shown in FIG. 1. FIG. 3 is a schematic cross-sectional view along A-A' line shown in FIG. 2E.

Figure 2E:
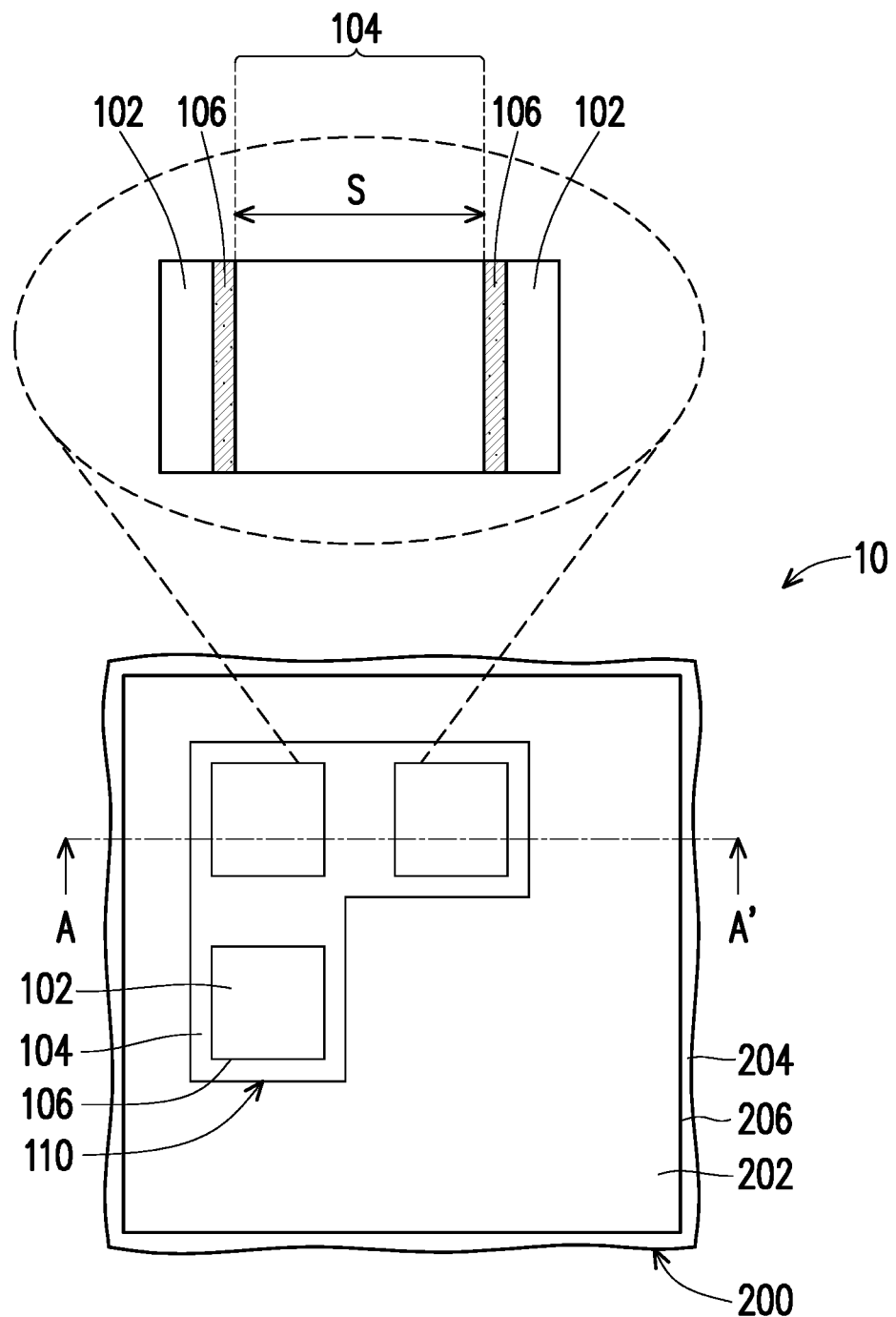
Figure 3:
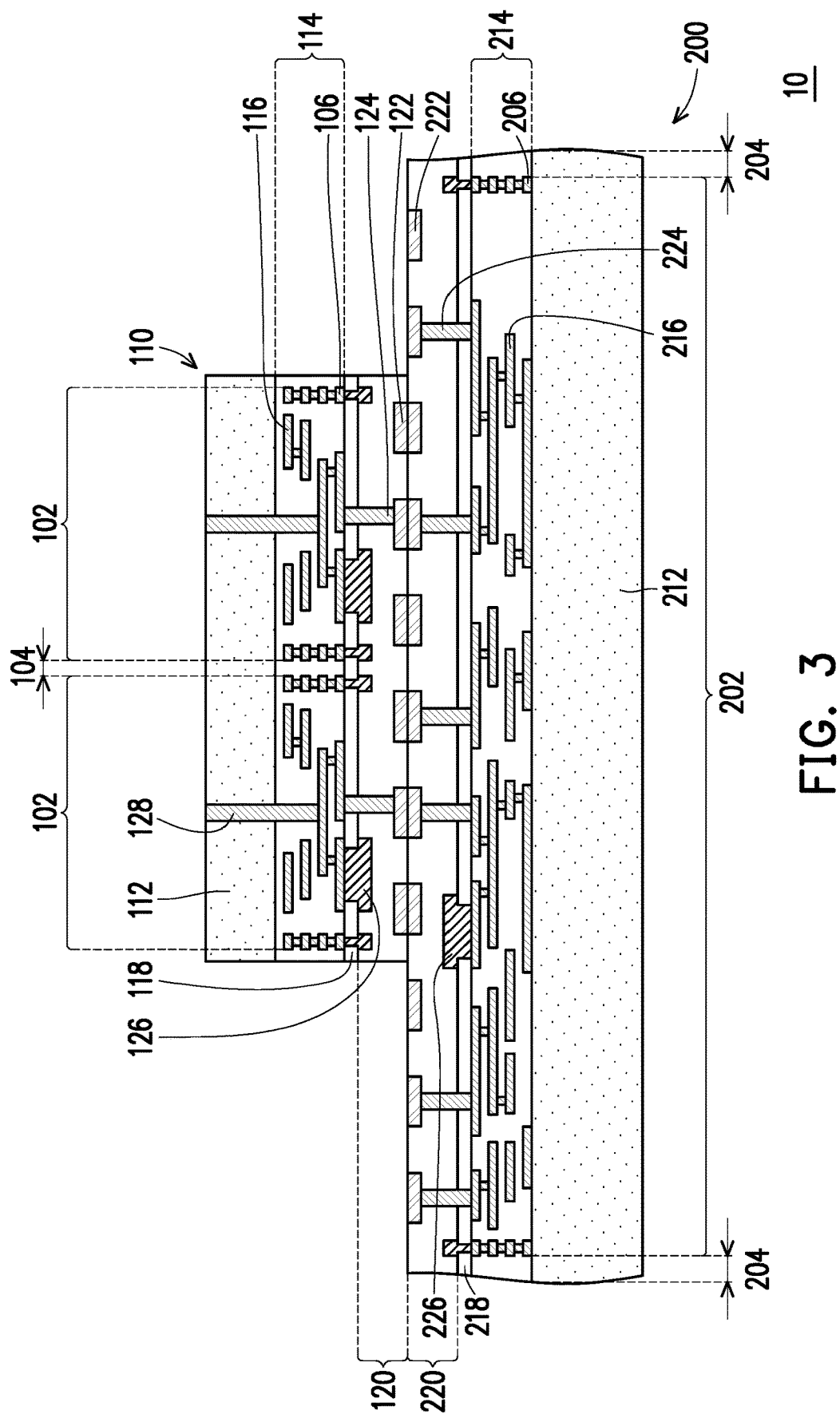
FIG. 3 is a schematic cross-sectional view along A-A' line shown in FIG. 2E.

In some embodiments, the semiconductor structure (e.g., the semiconductor structure 10 as shown in FIG. 2E and FIG. 3) includes a bottom device wafer and at least one top device die bonded on the bottom device wafer via a hybrid bonding manner. In these embodiments, the method forming the semiconductor structure may include the following steps.

Referring to FIG. 1 and FIG. 2A, step S100 is performed, and a device wafer 100 is provided. The device wafer 100 includes multiple die regions 102 and a scribe line region 104. The die regions 102 are laterally spaced apart from one another by the scribe ling region 104. Each of the die regions 102 includes an integrated circuit (such as a memory integrated circuit, a wireless communication integrated circuit or the like), while the scribe line region 104 is configured to be at least partially removed during a singulation process for singulating the die regions 102. Once the die regions 102 are singulated from the device wafer 100, the singulated structures may be referred as device dies. In some embodiments, the device wafer 100 further includes seal rings 106 respectively define (i.e., laterally surround) one of the die regions 102. In these embodiments, the scribe line region 104 spans between the seal rings 106. The seal rings 106 may respectively be a close ring, such as a rectangular close ring. Alternatively, the seal rings 106 may respectively be an open ring. Those skilled in the art may modify patterns of the seal rings 106 according to process requirements, the present disclosure is not limited thereto.

Referring to FIG. 1 and FIG. 2B, step S102 is performed, and a mask pattern PR is formed on the device wafer 100. The mask pattern PR, such as a photoresist pattern, has an opening W exposing a portion of the scribe line region 104 to be removed during a subsequent singulation process. In some embodiments, more than one of the die regions 102 as well as a portion of the scribe line region spreading between these die regions 102 are laterally surrounded by the opening W, such that these die regions 102 will remain connected with one another by the portion of the scribe line region 104 after the subsequent singulation process. For instance, as shown in FIG. 2B, three of the die regions 102 arranged in a rotated "L" shape as well as a portion of the scribe line region 104 spreading between these die regions 102 are laterally surrounded by the opening W of the mask pattern PR. In those embodiments where the mask pattern PR is a photoresist pattern, a method for forming the mask pattern PR may include a coating process, an exposure process and a development process.

Referring to FIG. 1, FIG. 2B and FIG. 2C, step S104 is performed, and the die regions 102 and the portion of the scribe line region 104 enclosed by the opening W of the mask pattern PR are singulated from the device wafer 100. The singulated structure may be referred as a top device die 110. The top device die 110 includes multiple die regions 102 laterally spaced apart from one another, and includes a portion of the scribe line region 104 connecting these die regions 102 with one another. In those embodiments where each of the die regions 102 is defined by one of the seal rings 106, the portion of the scribe line region 104 in the top device die 110 spans between the seal rings 106. In other words, these seal rings 106 in the top device die 110 are spaced apart from one another, but connected together by the portion of the scribe line region 104 in the top device die 110. In some embodiments, the singulation process includes a plasma dicing process. During the plasma dicing process, the portion of the scribe line region 104 overlapped with the opening W of the mask pattern PR is subjected to an etching process, and are removed to separate the top device die 110 from the device wafer 100. Moreover, after performing the singulation process, the mask pattern PR (as shown in FIG. 2B) is removed by, for example, a stripping process or an ashing process.

Referring to FIG. 1, FIG. 2D and FIG. 2E, step S106 is performed, and the top device die 110 is bonded onto a device wafer 200. As similar to the device wafer 100 described with reference to FIG. 2A, the device wafer 200 includes multiple die regions 202 and a scribe line region 204 laterally surrounding each of the die regions 202. In addition, the device wafer 200 may further includes seal rings 206 respectively define (i.e. laterally surround) one of the die regions 202. The top device die 110 is bonded onto one of the die regions 202. A region enclosed by a dash line as shown in FIG. 2D indicates a site in one of the die regions 202 to be bonded with the top device die 110. In some embodiments, an integrated circuit in each die region 202 of the device wafer 200 (e.g., a logic integrated circuit) is different from the integrated circuit in each die region 102 of the device wafer 100 (e.g., a memory integrated circuit, a wireless communication integrated circuit or the like), and a footprint area of each die region 202 may be greater than a footprint area of each die region 102. In these embodiments, as shown in FIG. 2E, the bonded top device die 110 including multiple die regions 102 may be located within a span of the underlying die region 202 of the device wafer 200. A region enclosed by a dash line shown in FIG. 2E shows an enlarged view of a portion of the scribe line region 104 between adjacent die regions 102 in the top device die 110. As shown in the enlarged view, adjacent die regions 102 in the top device die 110 are connected with each other by a portion of the scribe ling region 104 in the top device die 110. A spacing between these adjacent die regions 102 may be defined by a spacing S between the seal rings 106 laterally surrounding these adjacent die regions 102. In some embodiments, the spacing S may range from 60 µm to 120 µm.

Regarding a method for bonding the top device die 110 onto the device wafer 200 (i.e., a chip-to-wafer bonding method), a pick and place (PNP) process may be used for placing the top device die 110 onto one of the die regions 202 of the device wafer 200. Subsequently, at least one thermal treatment(s) may be used for bonding the top device die 110 to the underlying die region 202 of the device wafer 200. As compared to a method including performing multiple PNP processes for respectively attaching a device die including a single die region onto the device wafer 200, the method according to the above-described embodiments only requires performing a single PNP process for bonding the top device die 110 having multiple die regions 102 onto the device wafer 200. Therefore, the method in the embodiments of the present disclosure may have a shorter cycle time.

Referring to FIG. 2E and FIG. 3, the structure including the device wafer 200 and the top device die 110 bonded onto the device wafer 200 may be referred as a semiconductor structure 10. As shown in FIG. 3, in some embodiments, the top device die 110 includes a substrate 112, active devices (not shown) formed at a surface of the substrate 112 and within the die regions 102, a stack of dielectric layers 114 globally covering the active devices and the substrate 112, and interconnections 116 in the stack of dielectric layers 114 and within the die regions 102. In these embodiments, the active devices may include metal-oxide-semiconductor field effect transistors (MOSFETs), bipolar junction transistors (BJTs), diodes or the like. In addition, the top device die 110 may further include passive devices (not shown) formed in the stack of dielectric layers 114 or at the surface of the substrate 112. The interconnections 116 are configured to interconnect the active devices and/or the passive devices. In those embodiments where the top device die 110 includes the seal rings 106, the seal rings 106 are disposed in the stack of dielectric layers 114, and each encloses the interconnections 116 in one of the die regions 102. Moreover, in some embodiments, the top device die 110 further includes a passivation layer 118 covering the stack of dielectric layers 114, insulating layers 120 stacked on the passivation layer, bonding pads 122 formed in the outermost insulating layer 120 (i.e., the bottommost insulating layer 120 as shown in FIG. 3), and routing structures 124 connecting the interconnections 116 to the bonding pads 122. Surfaces of the bonding pads 122 are substantially coplanar with a surface of the outermost insulating layer 120, and the surfaces of the bonding pads 122 and the outermost insulating layer 120 collectively define a bonding surface of the top device die 110 in contact with the device wafer 200. In some embodiments, the top device die 110 further includes test pads 126 embedded in the stack of insulating layers 120, and penetrating through the passivation layer 118 to establish electrical connection with the interconnections 116 and the seal rings 106. In these embodiments, the test pads 126 are used in a test procedure, and may not in electrical contact with the bonding pads 122. Furthermore, in some embodiments, the top device die 110 further includes through substrate vias (TSVs) 128 within the die regions 102. The TSVs 128 may extend to the interconnections 116 from a back surface of the substrate 112 opposite to the bonding surface of the top device die 110. Since the interconnections 116 are routed to the bonding pads 122 by the routing structures 124, the TSVs 128 may be in electrical contact with the bonding pads 122 through the interconnections 116 and the routing structures 124.

As similar to the top device die 110, the device wafer 200 may include a substrate 212, active devices (not shown) formed at a surface of the substrate 212 and within the die regions 202, a stack of dielectric layers 214 globally covering the active devices and the substrate 212, and interconnections 216 in the stack of dielectric layers 214 and within the die regions 202. In these embodiments, the active devices may include MOSFETs, BJTs, diodes or the like. In addition, the device wafer 200 may further include passive devices (not shown) formed in the stack of dielectric layers 214 or at the surface of the substrate 212. The interconnections 216 are configured to interconnect the active devices and/or the passive devices. In those embodiments where the device wafer 200 includes the seal rings 206, the seal rings 206 are disposed in the stack of dielectric layers 214, and each encloses the interconnections 216 in one of the die regions 202. Moreover, in some embodiments, the device wafer 200 further includes a passivation layer 218 covering the stack of dielectric layers 214, insulating layers 220 stacked on the passivation layer, bonding pads 222 formed in the outermost insulating layer 220 (i.e., the topmost insulating layer 220 as shown in FIG. 3), and routing structures 224 connecting the interconnections 216 to the bonding pads 222. Surfaces of the bonding pads 222 are substantially coplanar with a surface of the outermost insulating layer 220, and the surfaces of the bonding pads 222 and the outermost insulating layer 220 collectively define a bonding surface of the device wafer 200 in contact with the top device die 110. In some embodiments, the device wafer 200 further includes test pads 226 embedded in the stack of insulating layers 220, and penetrating through the passivation layer 218 to establish electrical connection with the interconnections 216 and the seal rings 206. In these embodiments, the test pads 226 are used in a test procedure, and may not in electrical contact with the bonding pads 222. In addition, in some embodiments, the device wafer 200 may not include a TSV.

In some embodiments, the top device die 110 is bonded onto the device wafer 200 via a hybrid bonding manner. In these embodiments, the bonding pads 122 of the top device die 110 are bonded with the bonding pads 222 of the device wafer 200, and the outermost insulating layer 120 (i.e., the bottommost insulating layer 120 as shown in FIG. 3) of the top device die 110 is bonded with the outermost insulating layer 220 (i.e., the topmost insulating layer 220 as shown in FIG. 3) of the device wafer 200. The bonding pads 122 of the top device die 110 may be bonded onto a portion of the bonding pads 222 within one of the die regions 202 of the device wafer 200, and the outermost insulating layer 120 of the top device die 110 is bonded onto a portion of the outermost insulating layer 220 laterally surrounding the portion of the bonding pads 222 of the device wafer 200. In some embodiments, a bonding process for the bonding pads 122, 222 follows a bonding process for the outermost insulating layers 120, 220. In these embodiments, the outermost insulating layers 120, 220 are bonded with each other before performing the bonding process for the bonding pads 122, 222. Even though the bonding pads 122, 222 may expand during the bonding process, the bonding between the outermost insulating layers 120, 220 may prevent the outermost insulating layers 120, 220 from being spaced apart from each other as a result of the expansion of the bonding pads 122, 222. In some embodiments, each of the bonding processes includes a thermal treatment, and the thermal treatment for bonding the outermost insulating layers 120, 220 (referred as a first thermal treatment hereinafter) may have a heating temperature lower than a heating temperature of the thermal treatment for the bonding pads 122, 222 (referred as a second thermal treatment hereinafter). For instance, the heating temperature of the first thermal treatment may range from 150° C. to 250° C., while the heating temperature of the second thermal treatment may range from 180° C. to 350° C. However, those skilled in the art may alter the sequential order of the bonding processes as described above according to process requirements, the present disclosure is not limited thereto.

Once the top device die 110 is bonded onto the device wafer 200, interconnection between the top device die 110 and the die region 202 of the device wafer 200 bonded with the device die 110 can be established. In those embodiments where the top device die 110 is formed with the TSVs 128, the integrated circuit in the die region 202 bonded with the top device die 110 as well as the integrated circuits in the top device die 110 can be routed to a back side of the substrate 112 of the device die 110 facing away from the device wafer 200.

Figure 4:
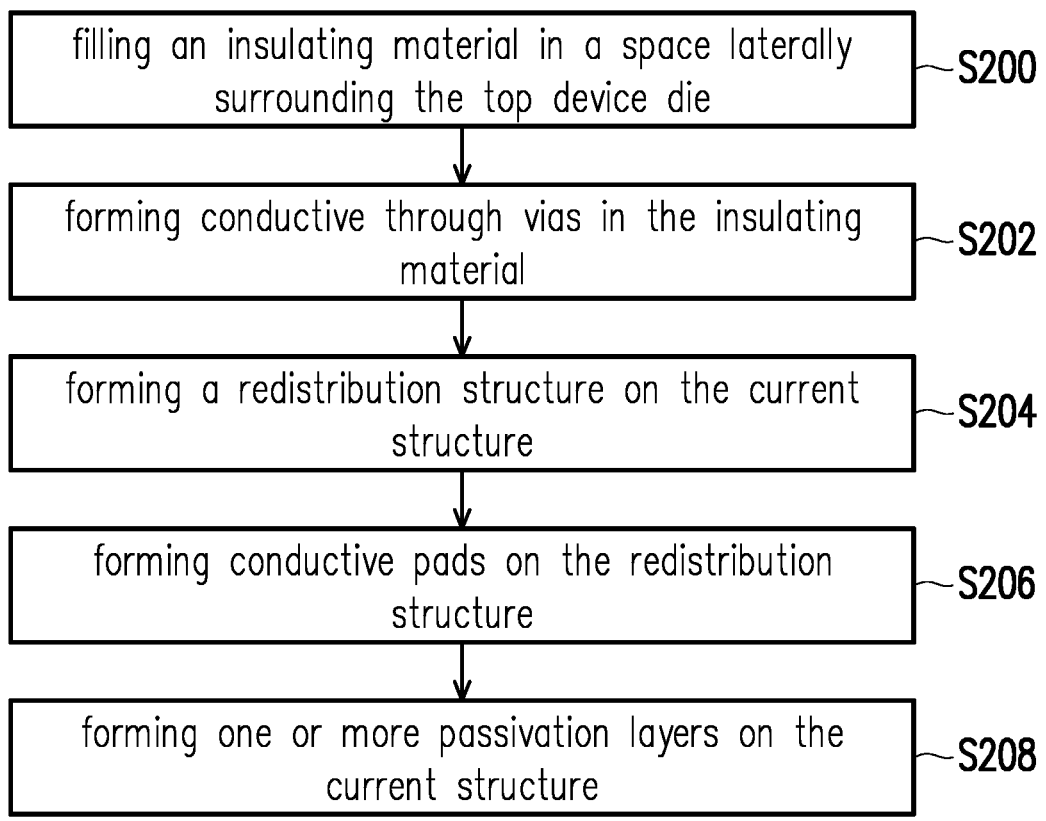
FIG. 4 is a flow diagram illustrating a method for packaging the semiconductor structure as shown in FIG. 2E and FIG. 3.

FIG. 4 is a flow diagram illustrating a method for packaging the semiconductor structure 10 as shown in FIG. 2E and FIG. 3. FIG. 5A through FIG. 5D are schematic cross-sectional views illustrating structures at various stages during the packaging process of the semiconductor structure 10 as shown in FIG. 4. In some embodiments, the packaging method includes the following steps.

Figure 5A:
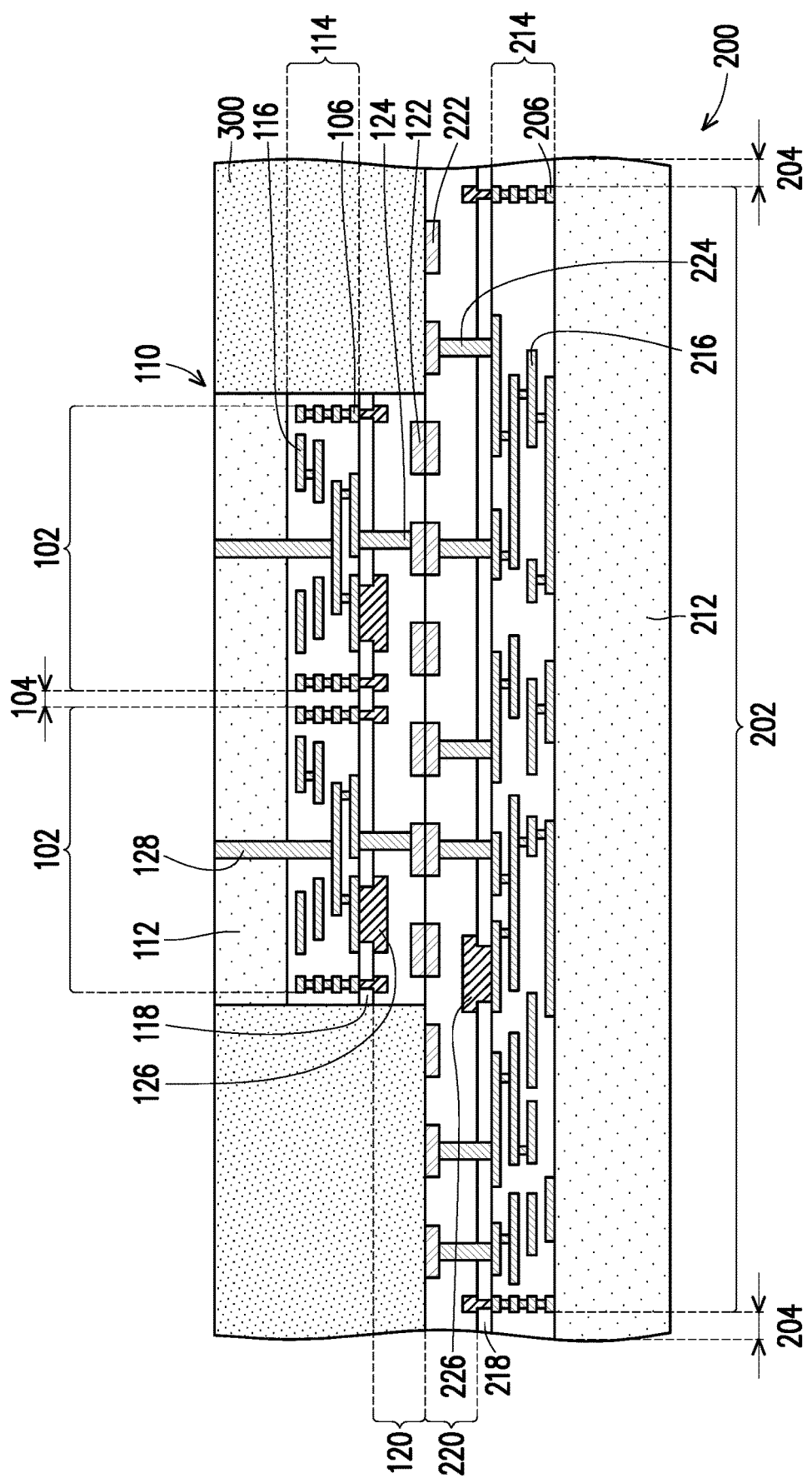
FIG. 5A through FIG. 5D are schematic cross-sectional views illustrating structures at various stages during the packaging process of the semiconductor structure as shown in FIG. 4.

Referring to FIG. 4 and FIG. 5A, step S200 is performed, and an insulating material 300 is filled in a space laterally surrounding the top device die 110. A portion of the device wafer 200 not bonded with the top device die 110 as well as a sidewall of the top device die 110 are covered by the insulating material 300. Since the die regions 102 of the top device die 110 are connected with each other by a portion of the scribe line region 104, a gap is absent in between the die regions 102, and the insulating material 300 would not be filled between the die regions 102. As a result, a volume of the insulating material 300 can be reduced, thus warpage of the eventually formed semiconductor package (e.g., the semiconductor package 30 as shown in FIG. 6A through FIG. 6D) can be reduced. In some embodiments, the insulating material 300 is an inorganic insulating material, such as silicon oxide (e.g., tetraethoxysilane (TEOS)). In these embodiments, a method for forming the insulating material 300 may include a deposition process, such as a chemical vapor deposition (CVD) process. In addition, the insulating material 300 may be initially formed to a height over a top surface of the top device die 110, and a planarization process may be subsequently formed to remove a portion of the insulating material 300 above the top device die 110, such that a top surface of the insulating material 300 could be substantially coplanar with a top surface (i.e., a back surface) of the top device die 110. In some embodiments, the planarization process includes a chemical mechanical polishing (CMP) process, an etching process or a combination thereof. A thickness of the insulating material 300 is substantially equal to a thickness of the top device die 110, such as in a range from 15 µm to 25 µm.

However, those skilled in the art may select other viable materials as well as other formation methods for forming the insulating material 300 according to process requirements, the present disclosure is not limited thereto. For instance, in alternative embodiments, the insulating material 300 may be a polymer material (e.g., epoxy), and a method for forming the insulating material 300 may include a transfer molding process, a compression molding process or other viable molding process. As other examples, the insulating material 300 may be silicon nitride, silicon oxynitride or so forth, and a method for forming the insulating material 300 may include a deposition process (e.g., a CVD process), a solution process (e.g., a spin coating process) or the like.

Figure 5B:
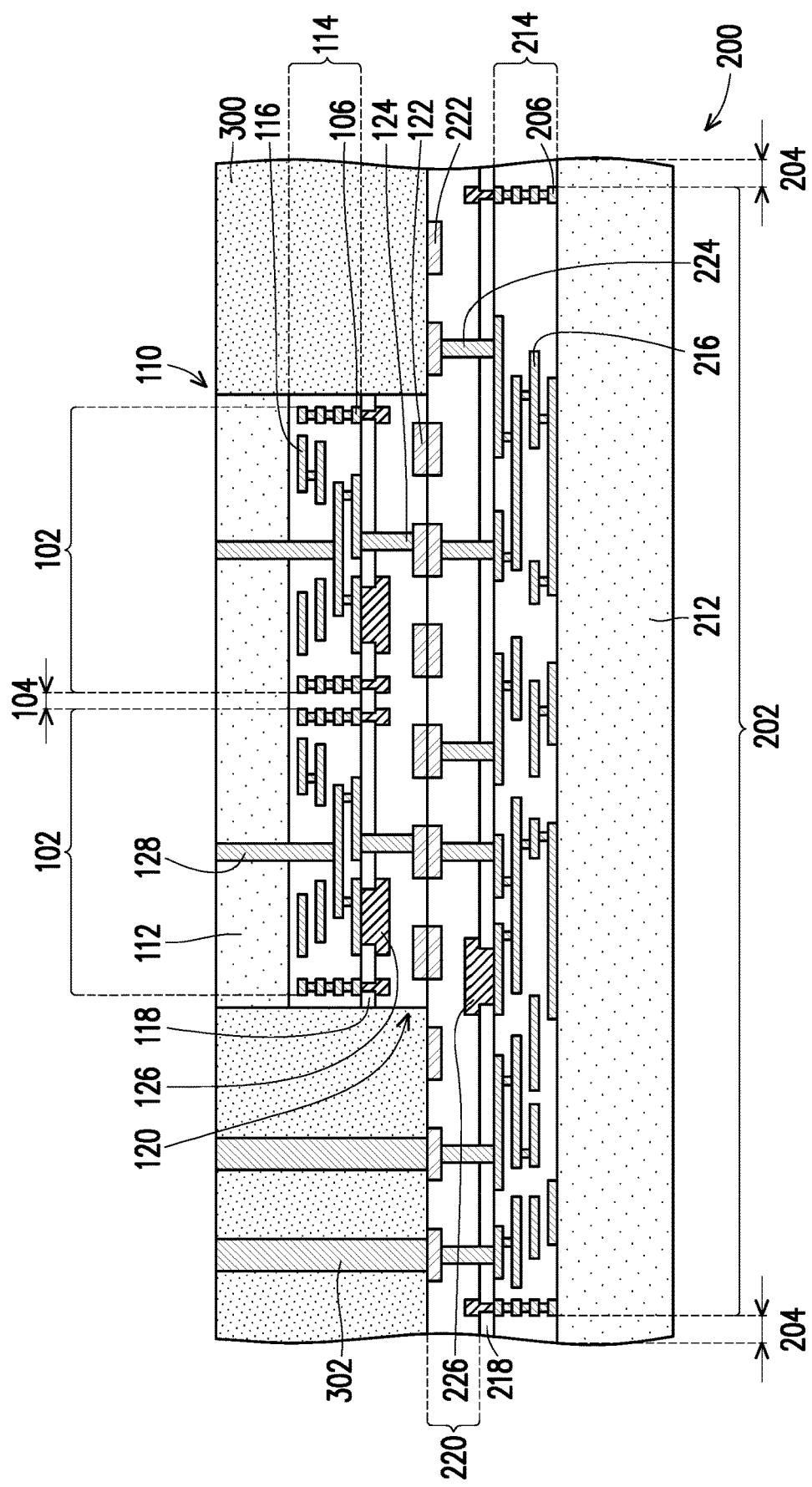

Referring to FIG. 4 and FIG. 5B, step S202 is performed, and conductive through vias 302 are formed in the insulating material 300. The conductive through vias 302 are located aside the top device die 110, and penetrate through the insulating material 300, to be in contact with some of the bonding pads 222 of the device wafer 200. In addition to the routing path through the top device die 110, the integrated circuits in the device wafer 200 may be routed to a top side of the current structure through the conductive through vias 302. In some embodiments, a method for forming the conductive through vias 302 includes forming through holes in the insulating material 300 by a lithography process and an etching process. Subsequently, a conductive material (e.g. copper) is filled into these through holes, to form the conductive through vias 302. In some embodiments, a method for forming the conductive material includes a deposition process (e.g., a physical vapor deposition (PVD) process), a plating process or a combination thereof. In addition, in some embodiments, a planarization process may be used for removing portions of the conductive material above the insulating material 300. For instance, the planarization process may include a CMP process, an etching process or a combination thereof. In those embodiments where the insulating material 300 is made of silicon oxide or other inorganic material and the through vias are defined by the lithography process and the etching process, the conductive through vias 302 can be formed with a fine critical dimension. For instance, a width of each conductive through via 302 may be less than 10 μm. On the other hand, in other embodiments, the insulating material 300 is made of a polymer material. In such embodiments, the conductive through vias 302 may be formed by a lithography process and a plating process before formation of the insulating material 300. Alternatively, the conductive through vias 302 may be formed by a drilling process (e.g., a laser drilling process) after formation of the insulating material 300. Either way, the conductive through vias 302 may be formed with a relatively large critical dimension. For instance, in such alternative embodiments, a width of each conductive through via 302 may range from 50 μm to 200 μm.

Figure 5C:
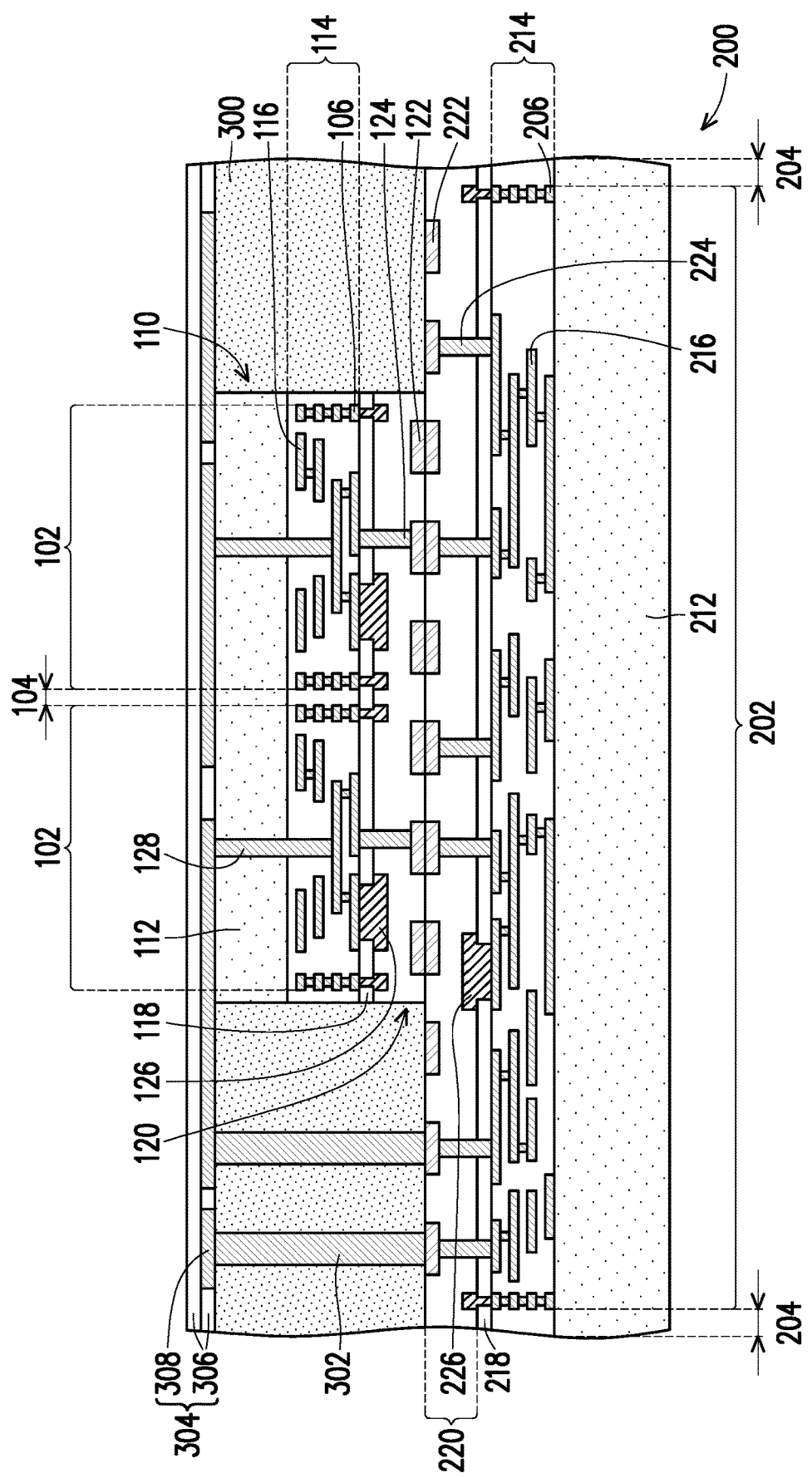

Referring to FIG. 4 and FIG. 5C, step S204 is performed, and a redistribution structure 304 is formed on the current structure. The redistribution structure 304 may globally cover the current structure, such that top surfaces of the insulating material 300, the conductive through vias 302 and the top device die 110 are covered by the redistribution structure 304. In some embodiments, the redistribution structure 304 includes a stack of dielectric layers 306 and redistribution elements 308 in the stack of dielectric layers 306. As an example, the redistribution structure 304 includes two dielectric layers 306, and the redistribution elements 308 are formed in the bottom dielectric layer 306 and covered by the top dielectric layer 306. The redistribution elements 308 include conductive traces connected to the conductive through vias 302 and the TSVs 128, and configured to rout the conductive through vias 302 and the TSVs 128. Some of the conductive traces may respectively connect to at least one of the conductive through vias 302 or at least one of the TSVs 128. In addition, others of the conductive traces may respectively connect to at least one of the conductive through vias 302 and at least one of the TSVs 128, so as to interconnect some of the conductive through vias 302 and some of the TSVs 128. However, more of the dielectric layers 306 may be formed, and the redistribution elements 308 spreading in the stack of dielectric layers 306 may include multiple levels of conductive traces, and include conductive vias connecting between vertically spaced apart conductive traces. Those skilled in the art may modify the design of the redistribution structure 304 according to process requirements, the present disclosure is not limited thereto. In some embodiments, a material of the dielectric layers 304 may include silicon oxide, silicon nitride, silicon oxynitride, the like or combinations thereof, while a material of the redistribution elements 308 may include copper, titanium, the like or combinations thereof. In some embodiments, a method for forming the redistribution structure 304 may include performing multiple deposition processes (e.g., CVD processes) for forming the dielectric layers 306, and include at least one damascene process for forming the redistribution elements 308 in the dielectric layers 306. Each damascene process may include forming a trench (or a trench and a via) in one of the dielectric layers 306, filling a conductive material into the trench (or the trench and the via) by a deposition process (e.g., a PVD process), a plating process or a combination thereof, and performing a planarization process (e.g., a CMP process, an etching process of a combination thereof) for removing portions of the conductive material above this dielectric layer 306.

In alternative embodiments, the dielectric layers 306 are made of a polymer material. In addition, a method for forming each dielectric layer 306 and the redistribution elements 308 therein may include forming a conductive pattern, forming a polymer material layer covering the conducive pattern by a coating process, and removing portions of the polymer material layer above the conductive pattern by a planarization process. The formation of the conductive pattern may include forming a photoresist pattern with openings, filling a conductive material into these openings, and removing the photoresist pattern.

Figure 5D:
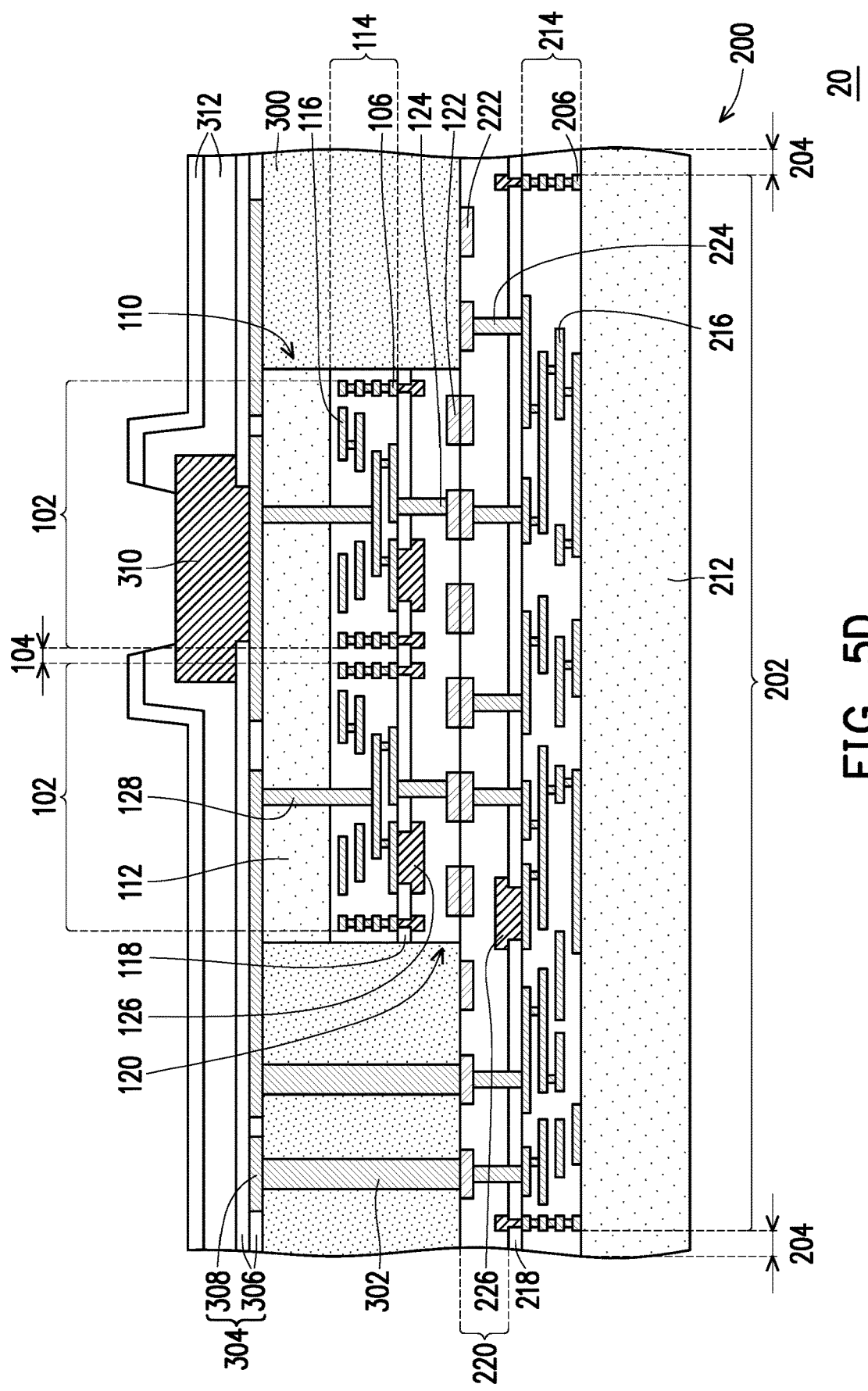

Referring to FIG. 4 and FIG. 5D, step S206 is performed, and conductive pads 310 are formed. The conductive pads 310 are formed on the redistribution structure 304, and may penetrate through the topmost dielectric layer 306 to establish electrical contact with the redistribution elements 308. It should be noted that, only one of the conductive pads 310 is depicted in FIG. 5D, while others of the conductive pads 310 are omitted from illustration. In some embodiments, a material of the conductive pads 310 may include aluminum or other conductive materials. A method for forming the conductive pads 310 may include forming openings in the topmost dielectric layer 306, forming a mask pattern on the topmost dielectric layer 306 and having openings wider than and overlapped with the openings of the topmost dielectric layer 306, filling a conductive material in the openings of the topmost dielectric layer 306 and the openings of the mask pattern, and removing the mask pattern. Alternatively, a method for forming the conductive pads 310 may include forming openings in the topmost dielectric layer 306, globally forming a conductive material layer on the topmost dielectric layer 306, and patterning the conductive material layer to form the conductive pads 310 by a lithography process and an etching process. Those skilled in the art may select suitable material and manufacturing process for forming the conductive pads 310, the present disclosure is not limited thereto.

Referring to FIG. 4 and FIG. 5D, step S208 is performed, and one or more passivation layers 312 are formed on the current structure. For instance, two passivation layers 312 are formed. The passivation layers 312 cover a top surface of the redistribution structure 304, and may further extend onto the conductive pads 310. In addition, the passivation layers 312 may have openings respectively expose a portion of one of the conductive pads 310. In some embodiments, materials of the passivation layers 312 respectively include an inorganic insulating material (e.g., silicon nitride) or a polymer material (e.g., polyimide). Moreover, the materials of the passivation layers 312 may be identical with or different from each other. A method for forming the passivation layers 312 may include globally forming passivation material layers on the redistribution structure 304 and the conductive pads 310 by deposition processes, coating processes or combinations thereof, and forming openings in the passivation material layers by a lithography process and an etching process, so as to form the passivation layers 312.

Up to here, a semiconductor structure 20 has been formed. The semiconductor structure 20 can be regarded as an intermediate semiconductor package, and may further be subjected to other packaging processes as will be described with reference to FIG. 6A through FIG. 6D.

FIG. 6A through FIG. 6D are schematic cross-sectional views illustrating structures obtained by further processing the semiconductor structure 20 as shown in FIG. 5D.

Figure 6A:
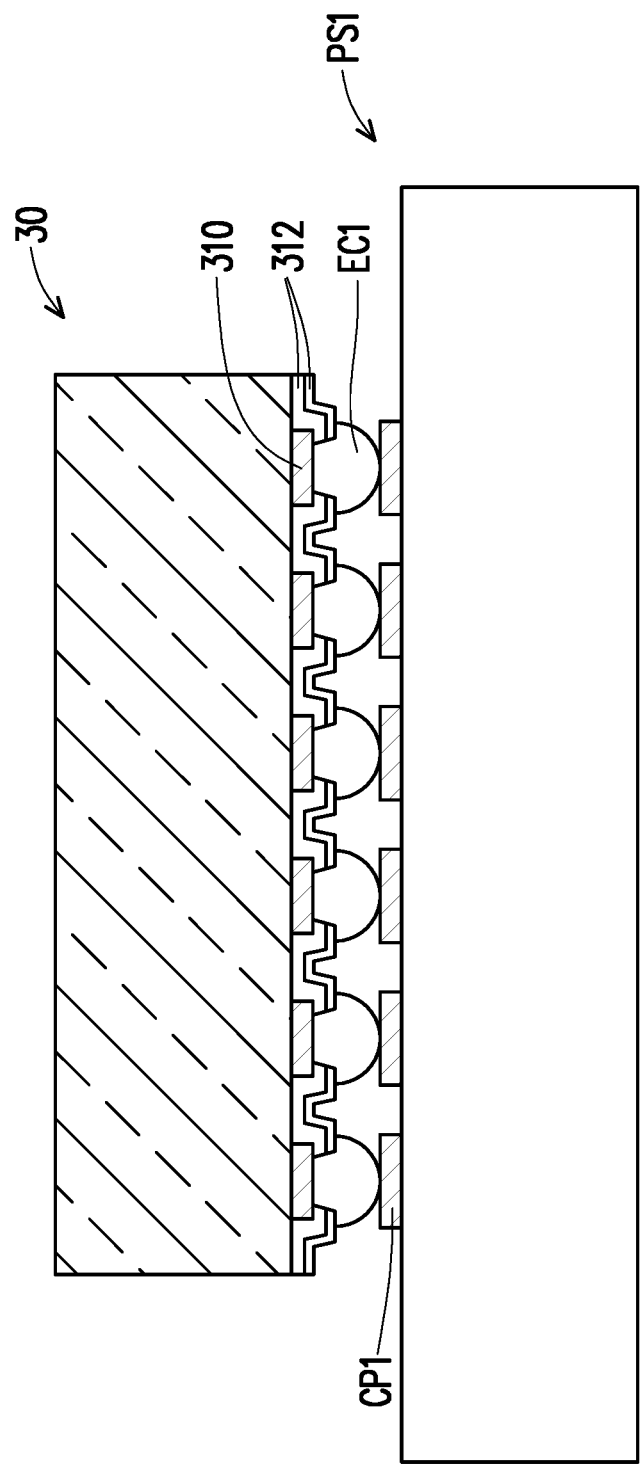
FIG. 6A through FIG. 6D are schematic cross-sectional views illustrating structures obtained by further processing the semiconductor structure as shown in FIG. 5D.

Referring to FIG. 5D and FIG. 6A, electrical connectors EC1 are formed on the conductive pads 310, and the semiconductor structure may be subjected to a singulation process. One of the die regions 202 in the device wafer 200 as well as the components above this die region 202 (as shown in FIG. 5D) are singulated from the device wafer 200. During the singulation process, a portion of the scribe line region 204 surrounding this die region 202 as well as the components thereabove are removed. The singulated structure is referred as a semiconductor package 30, which is briefly depicted in FIG. 6A, and the singulated die region 202 may be referred as a device die. Although not shown, the semiconductor package 30 includes the singulated die region 202 of the device wafer 200, the top device die 110, along with portions of the insulating material 300, the conductive through vias 302, the redistribution structure 304, the conductive pads 310, the passivation layers 312 and the electrical connectors EC1 overlapped with this die region 202. In some embodiments, the singulation process may be a blade sawing process, a plasma dicing process, the like or combinations thereof. In addition, in some embodiments, the semiconductor package 30 may be flipped over and bonded onto a package substrate PS1. The electrical connectors EC1 of the bonded semiconductor package 30 may be in contact with conductive pads CP1 of the package substrate PS1, so as to establish electrical connection between the semiconductor package 30 and the package substrate PS1. In embodiments where the package substrate PS1 is a printed circuit board (PCB), the electrical connectors EC1 may be ball grid array (BGA) balls.

Figure 6B:
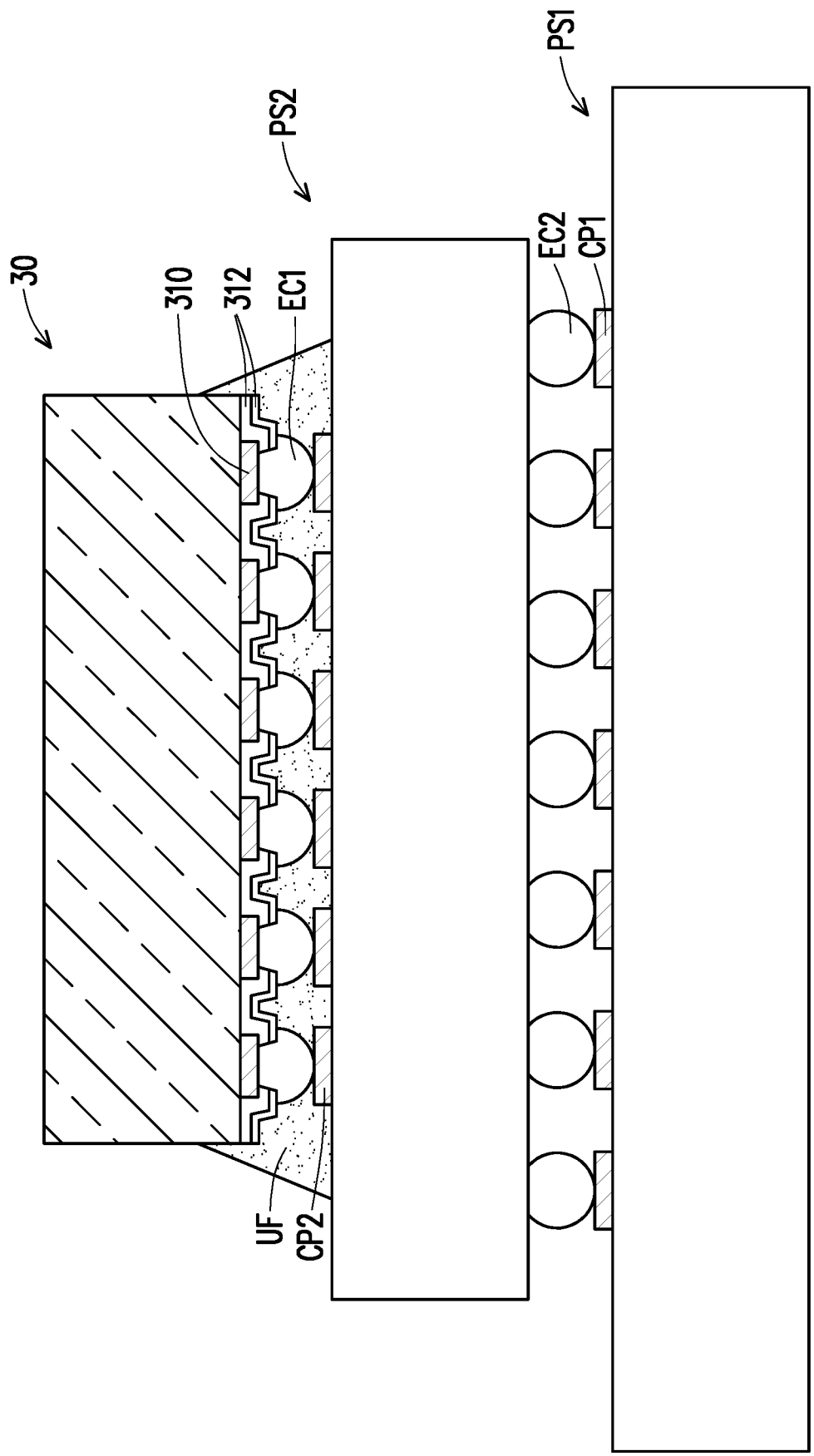

Referring to FIG. 6B, in some embodiments, the semiconductor package 30 is bonded on a package substrate PS2, and the package substrate PS2 bonded with the semiconductor package 30 is further bonded onto the package substrate PS1. In these embodiments, the package substrate PS2 is an interposing package substrate PS2, such as a build-up package substrate with a dielectric core layer or a core-less build-up package substrate. Alternatively, the package substrate PS2 may be a semiconductor substrate or a semiconductor-on-insulator (SOI) substrate. In addition, the electrical connectors EC1 of the semiconductor package 30 may be controlled collapse chip connection (C4) bumps or micro-bumps (μbumps), and may be bonded onto conductive pads CP2 of the package substrate PS2. In some embodiments, an underfill UF is provided on the package substrate PS2 to laterally surround the electrical connectors EC1. Moreover, the package substrate PS2 may be bonded onto the package substrate PS1 through electrical connectors EC2. The electrical connectors EC2 may be in contact with the conductive pads CP1 of the package substrate PS1. In those embodiments where the package substrate PS1 is a PCB, the electrical connectors EC2 may be BGA balls.

Figure 6C:
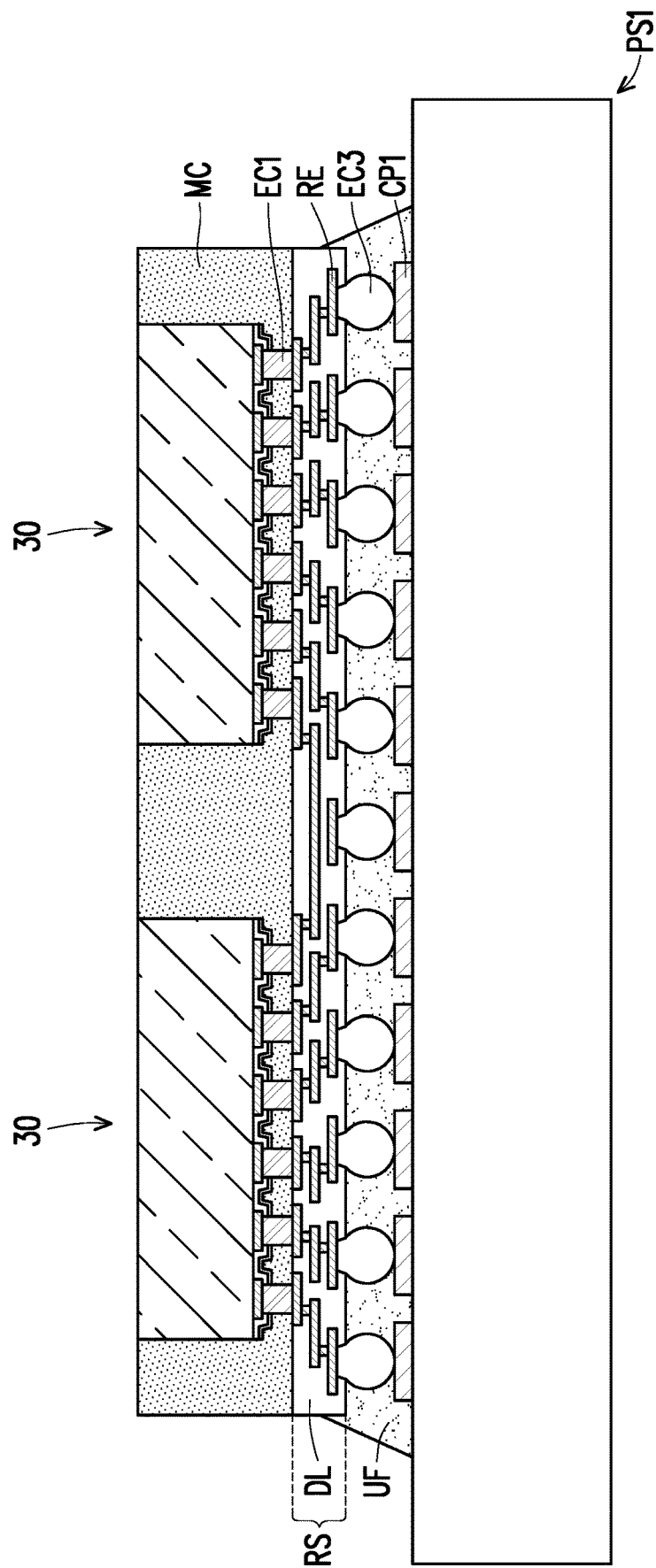

Referring to FIG. 6C, in some embodiments, one or more semiconductor packages 30 (e.g., two semiconductor packages 30) are encapsulated by an encapsulant MC. The electrical connectors EC1 may be conductive pillars (e.g., copper pillars), and may have surfaces substantially coplanar with a surface of the encapsulant MC. A redistribution structure RS may be formed at this surface of the encapsulant MC, and is in contact with the electrical connectors EC1. The electrical connectors EC1 can be routed to a side of the redistribution structure RS facing away from the semiconductor packages 30, and the semiconductor packages 30 may be interconnected through the redistribution structure RS. In some embodiments, the redistribution structure RS includes a stack of dielectric layers DL, and includes redistribution elements RE spreading in the stack of dielectric layers DL. The redistribution elements RE may include conductive traces and conductive vias, and are electrically connected to the electrical connectors EC1 of the semiconductor packages 30. In some embodiments, electrical connectors EC3 may be formed at the side of the redistribution structure RS facing away from the semiconductor packages 30. The electrical connectors EC3 are electrically connected to the redistribution elements RE. In some embodiments, the structure including the encapsulated semiconductor packages 30 and the redistribution structure RS are bonded onto the package substrate PS1 through the electrical connectors EC3. The electrical connectors EC3 may be in contact with the conductive pads CP1 of the package substrate PS1. In addition, the underfill UF may be provided on the package substrate PS1 to laterally surround the electrical connectors EC3. In those embodiments where the package substrate PS1 is a PCB, the electrical connectors EC3 may be BGA balls.

Figure 6D:
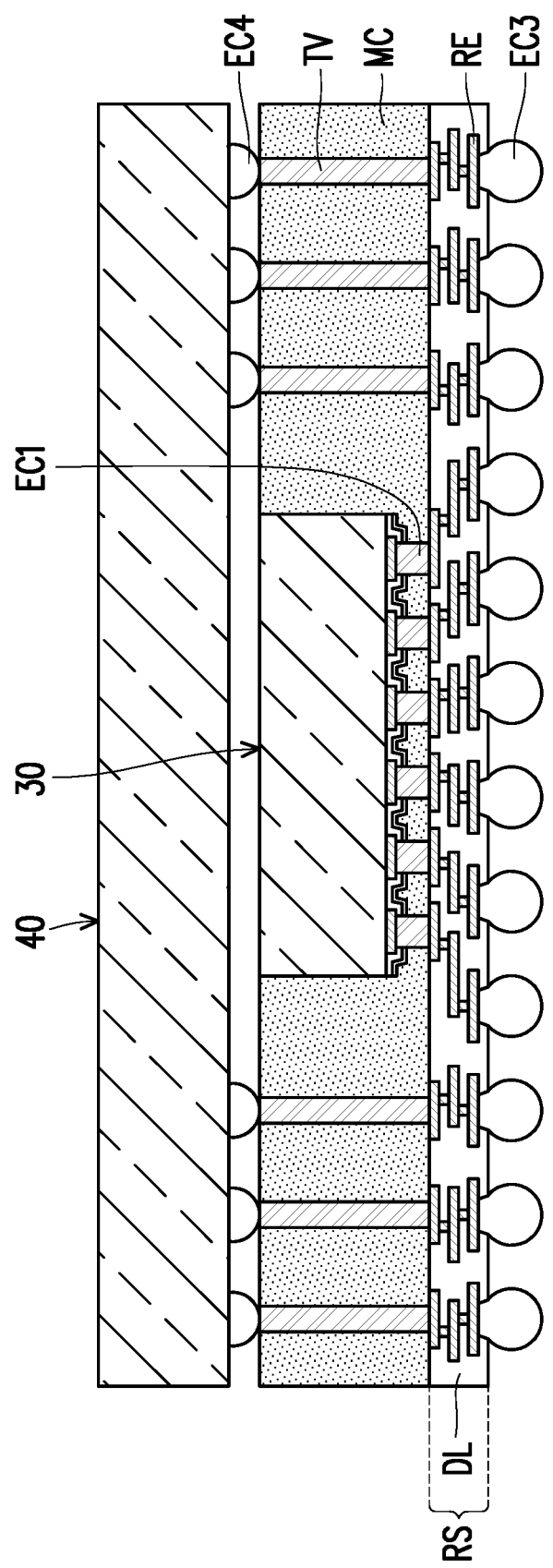

Referring to FIG. 6D, in some embodiments, the semiconductor package 30 is encapsulated by the encapsulant MC, and the redistribution structure RS is formed at a surface of the encapsulant MC and in contact with the electrical connectors EC1. In addition, the electrical connectors EC3 may be disposed at a side of the redistribution structure RS facing away from the semiconductor package 30. In these embodiments, the electrical connectors EC1 may be conductive pillars (e.g., copper pillars), whereas the electrical connectors EC3 may be BGA balls, C4 bumps or micro-bumps. In addition, another device die 40 (e.g., a memory die) may be bonded onto a side of the encapsulant MC facing away from the redistribution structure RS. Electrical connectors EC4 may be formed at a bottom side of the device die 40, and the device die 40 may be bonded onto the encapsulant MC through the electrical connectors EC4. In some embodiments, the electrical connectors EC4 may be BGA balls. Moreover, through encapsulant vias TV may be formed in the encapsulant MC. The through encapsulant vias TV penetrate through the encapsulant MC, and are electrically connected to the electrical connectors EC4 and the redistribution elements RE in the redistribution structure RS. In this way, the electrical connectors EC4 can be routed to the electrical connectors EC3 by the through conductive vias TV and the redistribution structure RS, and/or may be interconnected with the semiconductor package 30 by the through conductive vias TV and the redistribution structure RS.

Figure 7:
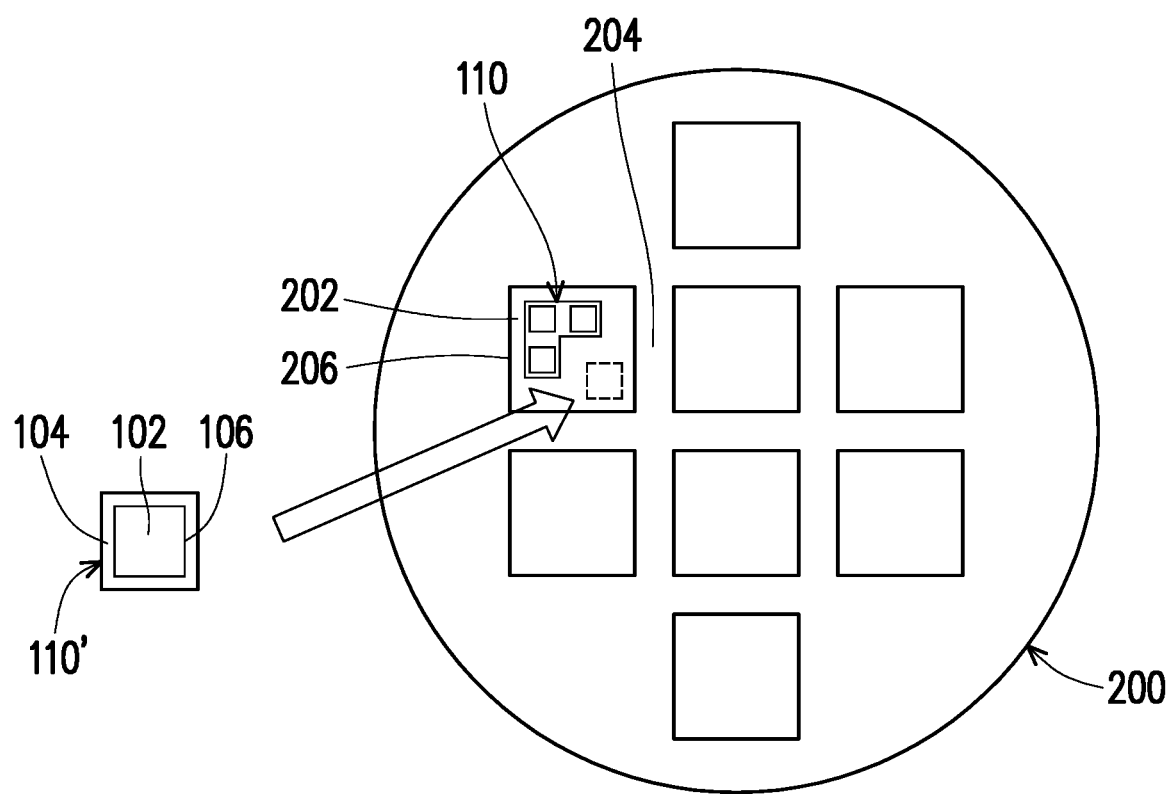
FIG. 7 is a schematic plan view illustrating bonding multiple top device dies onto one of the die regions of a bottom device wafer according to some embodiments of the present disclosure.

FIG. 7 is a schematic plan view illustrating bonding multiple top device dies onto one of the die regions of a bottom device wafer according to some embodiments of the present disclosure.

Referring to FIG. 7, in some embodiments, another top device die 110' is bonded onto the die region 202 of the device wafer 200 already bonded with the top device die 110. As similar to the description with reference to FIG. 2A through FIG. 2C, the top device die 110' is singulated from a device wafer, which may or may not be the device wafer 100 as shown in FIG. 2A. As an example, the top device die 110' is also singulated from the device wafer 100. The top device die 110 and the top device die 110' may include different amount of die regions 102. For instance, as shown in FIG. 7, the top device die 110 includes three die regions 102 connected with one another by a portion of the scribe line region 104, while the top device die 110' includes a single one of the die regions 102. Accordingly, a footprint area of the top device die 110 may be greater than a footprint area of the top device die 110', and a top view shape of the top device die 110 may be different from a top view shape of the top device die 110'. In alternative embodiments, the top device die 110' may be singulated from another device wafer (not shown). In addition, those skilled in the art may adjust the amount of die regions included in the top device dies 110, 110' as well as the footprints and top view shapes of the top device dies 110, 110' according to design needs, the present disclosure is not limited thereto.

Figure 8:
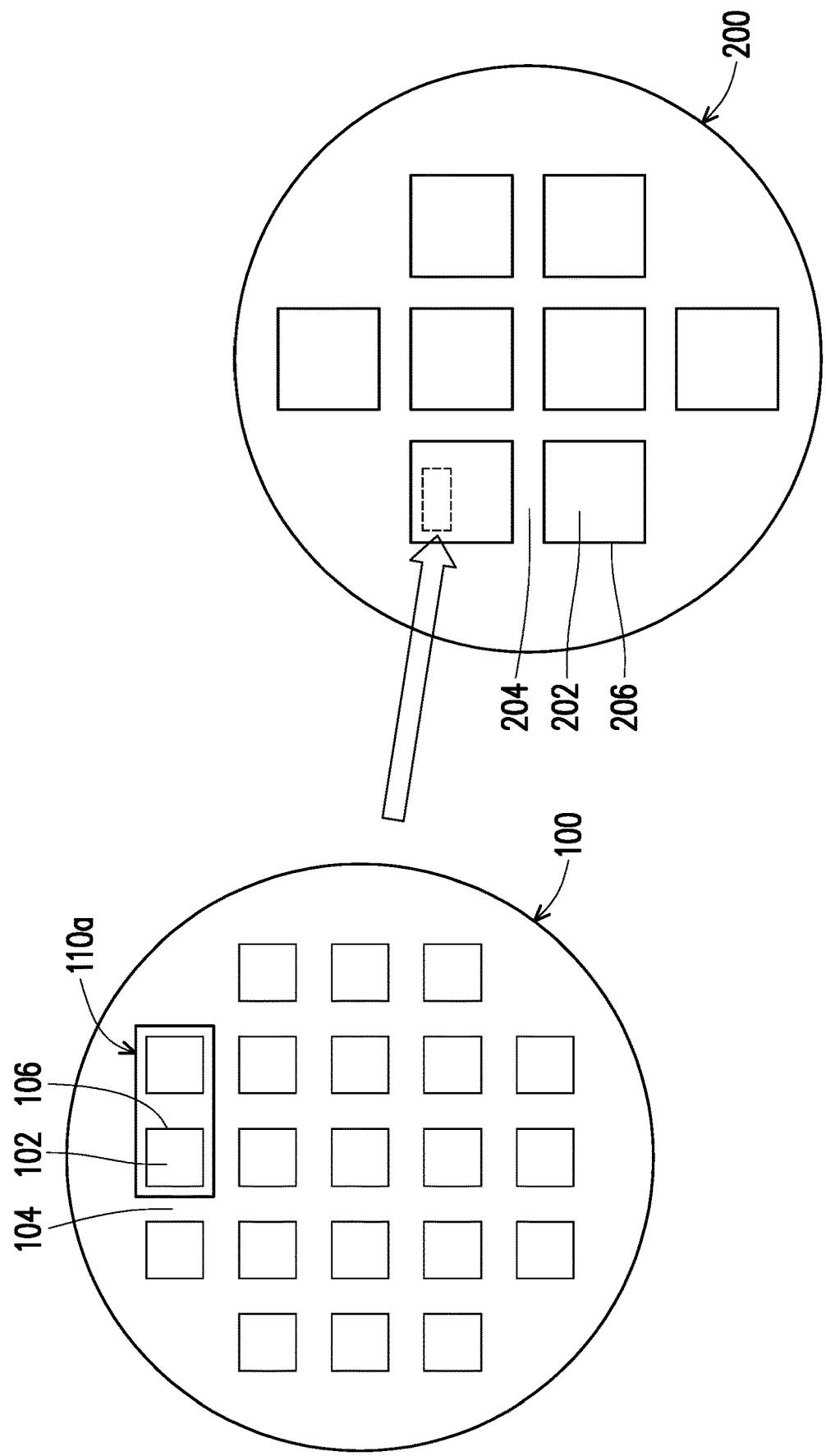
FIG. 8 and FIG. 9 are schematic plan views respectively illustrating bonding a top device die onto one of the die regions of a bottom device wafer according to some embodiments of the present disclosure.
Figure 9:
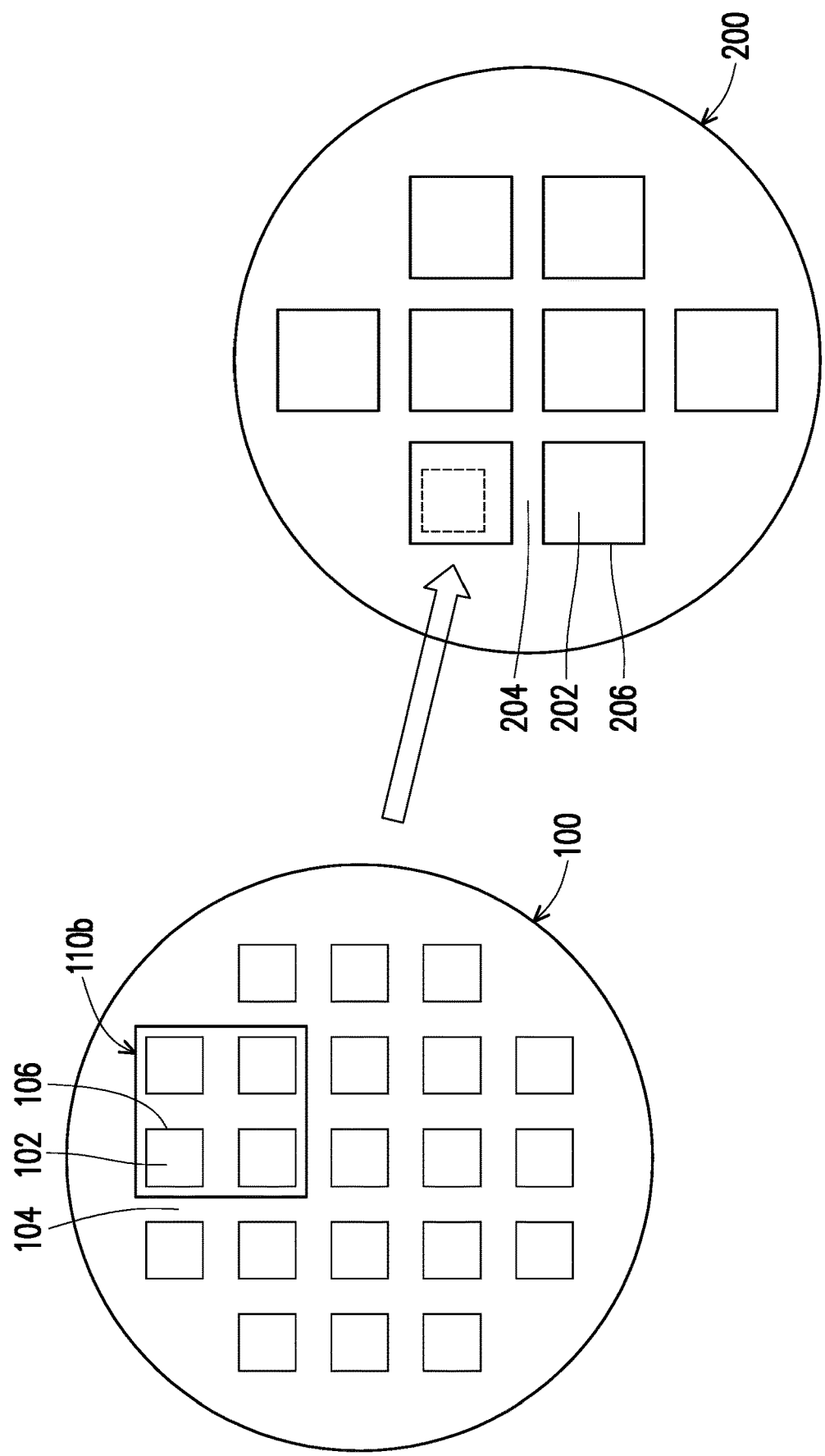

FIG. 8 and FIG. 9 are schematic plan views respectively illustrating bonding a top device die onto one of the die regions of a bottom device wafer according to some embodiments of the present disclosure. The embodiments to be described with reference to FIG. 8 and FIG. 9 are similar to the embodiments described with reference to FIG. 2A through FIG. 2D. Only differences therebetween will be discussed, the like or the same parts would not be repeated again.

Referring to FIG. 8, in some embodiments, a top device die 110a including two of the die regions 102 is singulated from the device wafer 100, and bonded onto one of the die regions 202 of the device wafer 200. By using the plasma dicing process as described with reference to FIG. 2B and FIG. 2C, multiple die regions 102 can be singulated simultaneously, and the die regions 102 in the singulated top device die 110a are connected with each other by a portion of the scribe line region 104 between these die regions 102. Based on difference in amount of the die regions 102 included in the top device die 110a shown in FIG. 8 and the top device die 110 shown in FIG. 2C and FIG. 2D, the top device dies 110, 110a may have different footprint areas as well as different top view shapes.

Referring to FIG. 9, in some embodiments, a top device die 110b including four of the die regions 102 is singulated form the device wafer 100, and bonded onto one of the die regions 202 of the device wafer 200. As similar to the description with reference to FIG. 8, the die regions 102 in the singulated device die 110b shown in FIG. 9 are connected with one another by a portion of the scribe line region 104. In some embodiments, four of the die regions 102 arranged in an array having two rows and two columns are singulated to form the top device die 110b, thus the top device die 110b has a rectangular top view shape. However, other groups of the die regions 102 may be selected for subjecting to the singulation process, such that the singulated device die 110b may have various top view shapes.

Figure 10A:
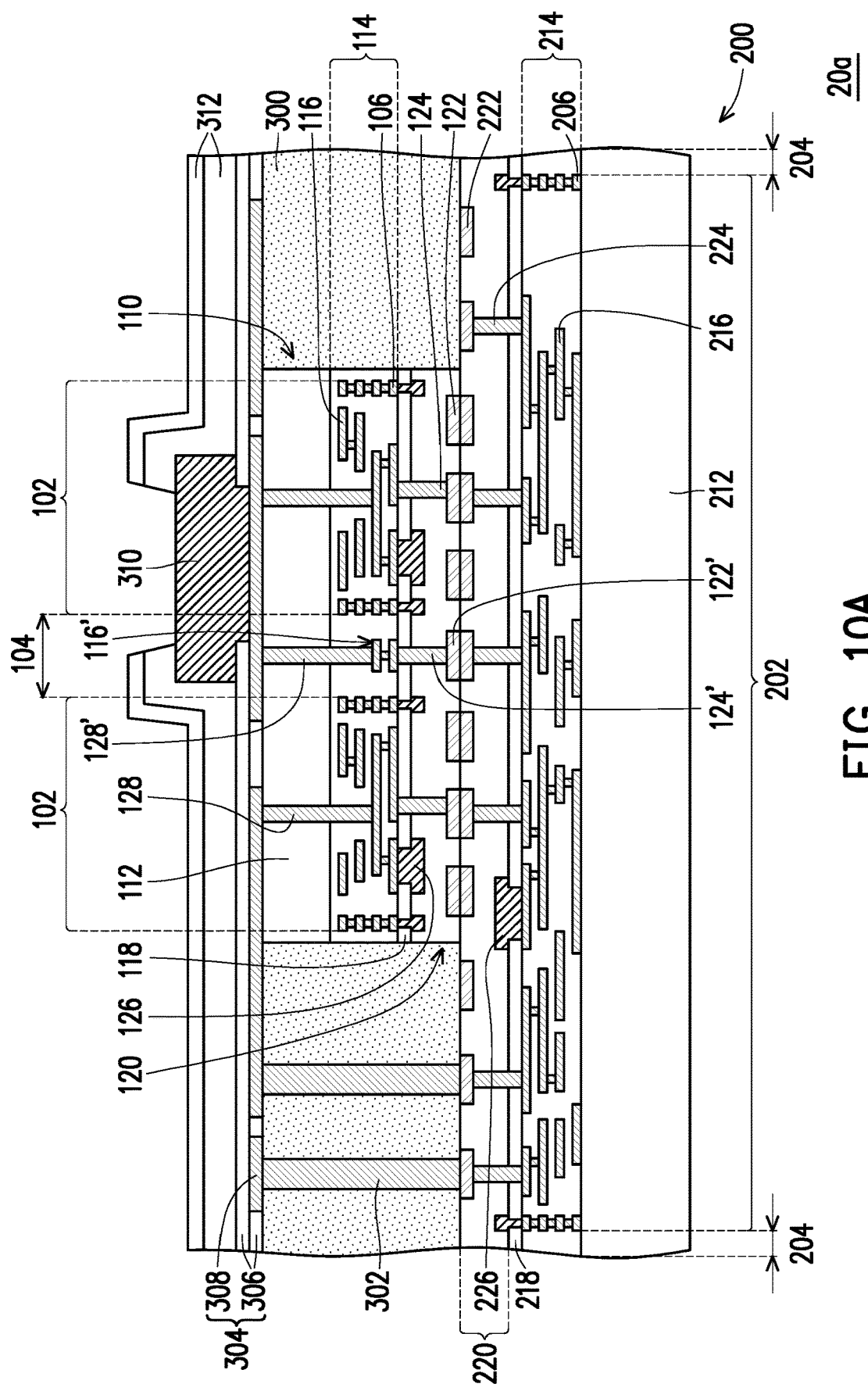
FIG. 10A is a schematic cross-sectional view of a semiconductor structure according to some embodiments of the present disclosure.
Figure 10B:
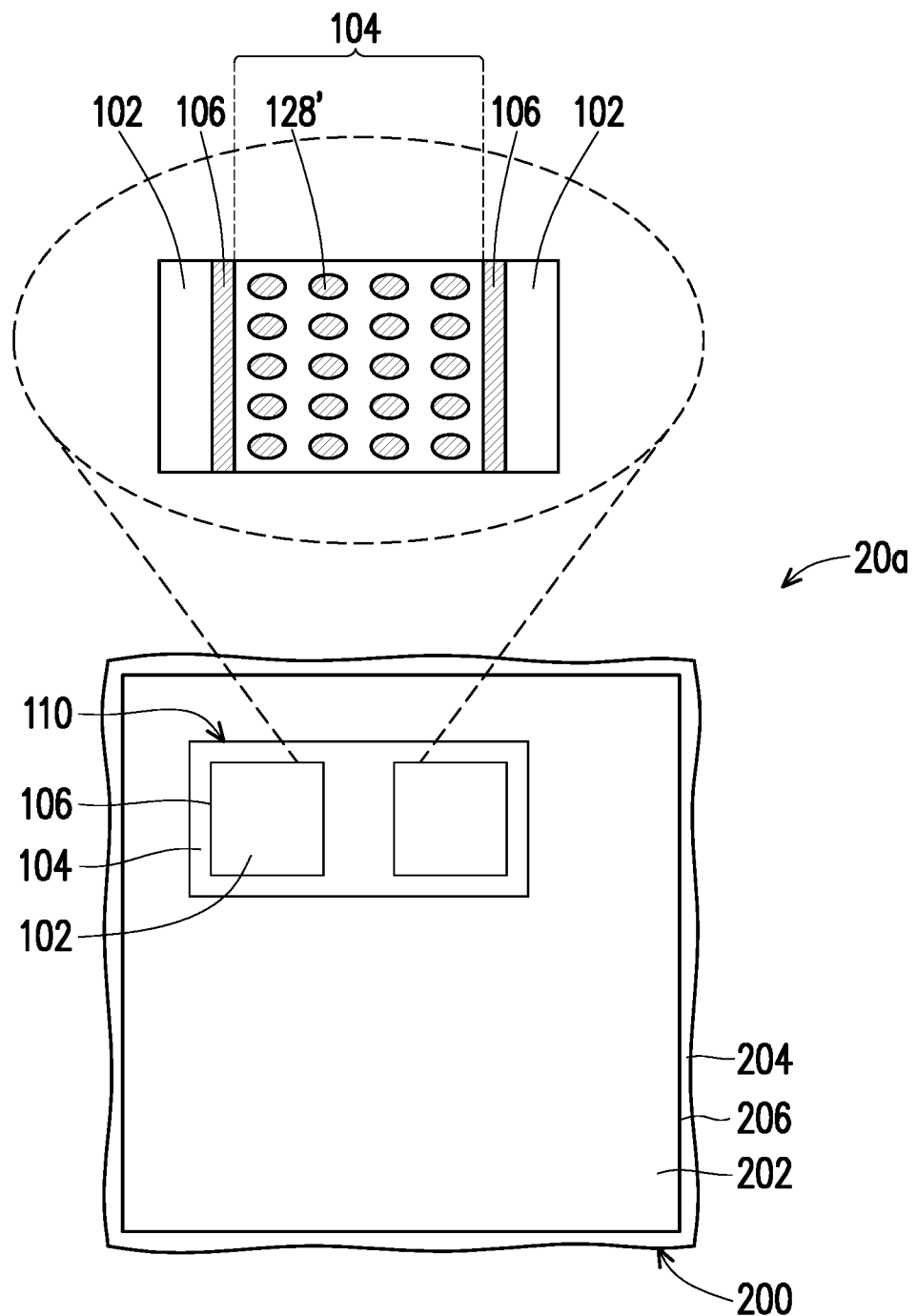
FIG. 10B is a schematic plan view illustrating some of the components in the semiconductor structure as shown in FIG. 10A.

FIG. 10A is a schematic cross-sectional view of a semiconductor structure 20a according to some embodiments of the present disclosure. FIG. 10B is a schematic plan view illustrating some of the components in the semiconductor structure 20a as shown in FIG. 10A. The semiconductor structure 20a is similar to the semiconductor structure 20 as shown in FIG. 5D. Only differences therebetween will be discussed, the same or the like parts would not be repeated again.

Referring to FIG. 10A and FIG. 10B, in some embodiments, the top device die 110 further includes additional TSVs 128' in the scribe line region 104 between adjacent die regions 102. It should be noted that, only one of the TSVs 128' is depicted in FIG. 10A for conciseness, while multiple TSVs 128' are shown in FIG. 10B. As shown in FIG. 10A, the TSVs 128' are located between adjacent seal rings 106, and extend into the stack of dielectric layers 114 from a back surface of the substrate 112 opposite to the bonding surface of the top device die 110. In some embodiments, the top device die 110 further includes additional interconnections 116', additional bonding pads 122' and additional routing structures 124' in the scribe line region 104 for routing the TSVs 128' to the bonding surface of the top device die 110. The interconnections 116' are formed in the stack of dielectric layers 114, and spread from terminals of the TSVs 128 embedded in the stack of dielectric layers 114 to a side of the stack of dielectric layers 114 facing away from the substrate 112. As similar to the interconnections 116, the interconnections 116' may also include conductive traces and conductive vias. The bonding pads 122' are laterally surrounded by the outermost insulating layer 120 (i.e., the bottommost insulating layer 120 as shown in FIG. 10A), and surfaces of the bonding pads 122, the bonding pads 122' and the outermost insulating layer 120 collectively define the bonding surface of the top device die 110. In addition, the routing structures 124' extend between the interconnections 116' and the bonding pads 122', and may penetrate through the passivation layer 118 and some of the insulating layers 120. The TSVs 128' as well as the interconnections 116', the routing structures 124' and the bonding pads 122' provide additional paths for routing the integrated circuit in the die region 202 of the device wafer 200 bonded with the top device die 110 to a back side of the top device die 110 (e.g., a top side of the top device die 110 as shown in FIG. 10A). As shown in an enlarged view of an area enclosed by a dash line in FIG. 10B, in some embodiments, the TSVs 128' are arranged in an array having multiple rows and multiple columns in the scribe line region 104 of the top device die 110. However, those skilled in the art may modify arrangement of the TSVs 128' according to design needs, the present disclosure is not limited thereto.

In some embodiments, the semiconductor structure 20a can be subjected to further packaging process as describe with reference to FIG. FIG. 5A through FIG. 5D, and FIG. 6A through FIG. 6D.

Figure 11:
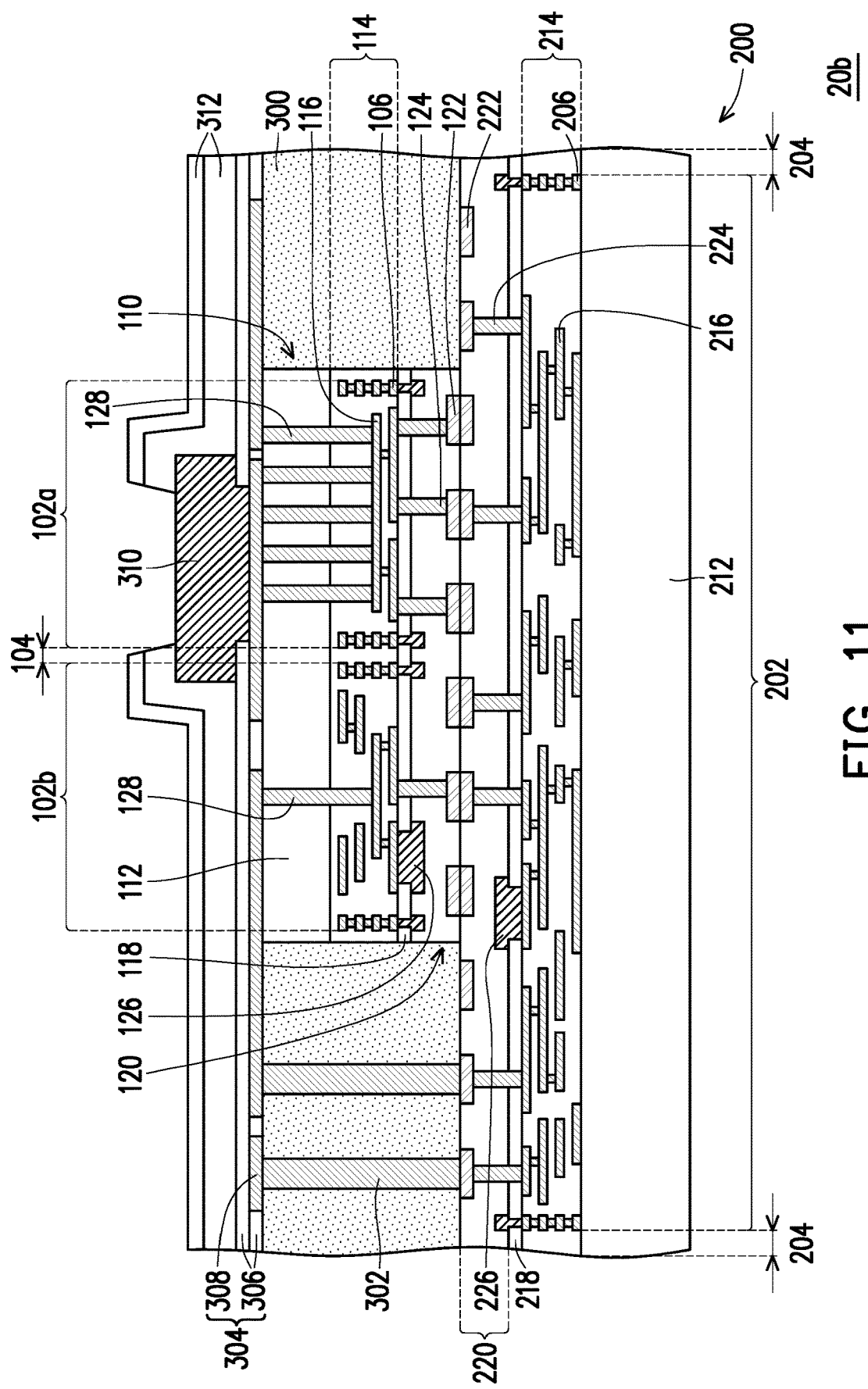
FIG. 11 is a schematic cross-sectional view illustrating a semiconductor structure according to some embodiments of the present disclosure.

FIG. 11 is a schematic cross-sectional view illustrating a semiconductor structure 20b according to some embodiments of the present disclosure. The semiconductor structure 20b is similar to the semiconductor structure 20 as shown in FIG. 5D. Only differences therebetween will be discussed, the same or the like parts would not be repeated again.

Referring to FIG. 11, in some embodiments, the TSVs 128 within a die region 102a are much more than the TSVs 128 within a die region 102b. In some embodiments, the die region 102a is mainly functioned for connecting the integrated circuit in the die region 202 of the device wafer 200 bonded with the top device die 110 to a back side of the top device die 110 (e.g., a top side of the top device die 110 as shown in FIG. 5D). In these embodiments, the die region 102a may not include active devices as well as test pads 126. Alternatively, active devices and test pads 126 may be included in the die region 102a. In addition, although not shown, at least some of the through encapsulant vias 302 may be omitted, since the top device die 110 has more TSVs 128 (e.g., within the die region 102a) for routing the integrated circuit in the die region 202 to a top side of the top device die 110.

In some embodiments, the semiconductor structure 20b can be subjected to further packaging process as describe with reference to FIG. FIG. 5A through FIG. 5D, and FIG. 6A through FIG. 6D.

As above, the semiconductor package according to embodiments of the present disclosure includes a bottom device die and a top device die bonded onto the bottom device die. The top device die includes multiple die regions and a scribe line region connecting the die regions with one another. When an insulating material is formed on the bottom device die to a height of the top device die, the insulating material may be absent in between the die regions of the top device die, since the die regions are connected with each other by the scribe line region. Therefore, a volume of the insulating material may be reduced, thus warpage of the semiconductor package can be reduced. During a process for singulating the top device die from a device wafer, multiple die regions of the device wafer are simultaneously separated from the device wafer, and the singulated die regions are connected with one another by a scribe line region. Accordingly, only a single pick and place process is required for bonding the top device die having multiple die regions onto the bottom device die. Therefore, a process time for forming the semiconductor package can be effectively shortened.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an aspect of the present disclosure, a semiconductor package is provided. The semiconductor package comprises: a first device die, comprising first bonding pads at a front surface of the first device die; and a second device die, bonded on the first device die, and comprising die regions and a scribe line region connecting the die regions with one another, wherein the die regions respectively comprise second bonding pads at a front surface of the second device die, and the second bonding pads are respectively in contact with one of the first bonding pads.

In another aspect of the present disclosure, a semiconductor package is provided. The semiconductor package comprises: a first device die, comprising first bonding pads at a front surface of the first device die; a second device die, bonded on the first device die, and comprising die regions and a scribe line region connecting the die regions with one another, wherein the die regions respectively comprise second bonding pads at a front surface of the second device die, and the second bonding pads are respectively in contact with one of the first bonding pads; and through substrate vias, extending from a back surface of the second device die into the second device die, and respectively located within one of the die regions of the second device die.

In yet another aspect of the present disclosure, a manufacturing method of a semiconductor package is provided. The method comprises: providing a first device wafer, wherein the first device wafer comprises first die regions and a first scribe line region extending between the first die regions; providing a second device wafer, wherein the second device wafer comprises second die regions and a second scribe line region extending between the second die regions; forming a mask pattern on the second device wafer, wherein the mask pattern has an opening overlapped with a portion of the second scribe line region laterally surrounding more than one of the second die regions; removing the portion of the second scribe line region overlapped with the opening of the mask pattern, to singulated a device die having the more than one of the second die regions from the second device wafer; removing the mask pattern; and bonding the device die onto one of the first die regions of the first device wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
 a first device die, comprising first bonding pads at a front surface of the first device die; and
 a second device die, bonded on the first device die, and comprising die regions and a scribe line region, wherein seal rings each enclosing one of the die regions are laterally spaced apart from one another, the scribe line region extends in between the seal rings, the die regions respectively comprise second bonding pads at a front surface of the second device die, and the second bonding pads are respectively in contact with one of the first bonding pads.

2. The semiconductor package according to claim 1, further comprising an insulating material, laterally surrounding the second device die and in contact with a portion of the front surface of the first device die.

3. The semiconductor package according to claim 2, wherein the insulating material is absent in between the die regions of the second device die.

4. The semiconductor package according to claim 2, further comprising conductive through vias, penetrating through the insulating material, and respectively in contact with one of the first bonding pads.

5. The semiconductor package according to claim 1, wherein the first device die further comprises a first insulating layer laterally surrounding the first bonding pads, the second device die further comprises a second insulating layer laterally surrounding the second bonding pads, and substantially the entire second insulating layer is in contact with the first insulating layer.

6. The semiconductor package according to claim 1, wherein the first device die has a footprint area greater than a footprint area of the second device die.

7. The semiconductor package according to claim 1, wherein the first device die comprises a die region, and the first bonding pads are located within the die region of the first device die.

8. The semiconductor package according to claim 1, wherein the die region of the first device die is overlapped with the die regions and the scribe line region of the second device die.

9. A semiconductor package, comprising:
a first device die, comprising first bonding pads at a front surface of the first device die;
a second device die, bonded on the first device die, and comprising die regions and a scribe line region, wherein seal rings each enclosing one of the die regions are laterally spaced apart from one another, the scribe line region extends in between the seal rings, the scribe line region extends in between the seal rings, the die regions respectively comprise second bonding pads at a front surface of the second device die, and the second bonding pads are respectively in contact with one of the first bonding pads; and
through substrate vias, extending from a back surface of the second device die into the second device die, and respectively located within one of the die regions of the second device die.

10. The semiconductor package according to claim 9, further comprising:
additional through substrate vias, extending from the back surface of the second device die into the second device die, and located within the scribe line region.

11. The semiconductor package according to claim 10, wherein the second device die further comprises additional bonding pads located at the front surface of the second device die and within the scribe line region of the second device die, and the additional through substrate vias are electrically connected to the additional bonding pads.

12. The semiconductor package according to claim 11, wherein the additional bonding pads are respectively in contact with one of the first bonding pads of the first device die.

13. A semiconductor package, comprising:
a first device die, comprising a first seal ring extending along an outline of the first device die, and comprising first bonding pads at a front surface of the first device die; and
a second device die, having second bonding pads at a front surface of the second device die and bonded onto the first bonding pads of the bottom device die, and comprising more than two die regions laterally spaced apart from one another and a scribe line region extending in between and surrounding each of the die regions, wherein each of the die regions is enclosed by a second seal ring, the second seal rings are connected with each other and each surrounded by the scribe line region, and the second seal rings are laterally surrounded by the underlying first seal ring.

14. The semiconductor package according to claim 13, further comprising:
a third device die, bonded onto the first device die and laterally separated from the second device die.

15. The semiconductor package according to claim 14, wherein the second device die and the third device die are located within the outline of the underlying first device die.

16. The semiconductor package according to claim 13, further comprising:
an insulating material, laterally surrounding the second device die;
a first redistribution structure, disposed on the insulating material and the second device die; and
conductive pads, disposed on the first redistribution structure.

17. The semiconductor package according to claim 16, further comprising:
conductive through vias, penetrating through the insulating material, to establish connection between the first device die and the first redistribution structure.

18. The semiconductor package according to claim 16, further comprising:
a package substrate, wherein the conductive pads are attached to the package substrate through electrical connectors.

19. The semiconductor package according to claim 16, further comprising:
a molding compound, encapsulating the first device die, the second device die, the insulating material and the first redistribution structure; and
a second redistribution structure, lying along a side of the molding compound, and connected to the conductive pads through electrical connectors.

* * * * *